US007923719B2

(12) United States Patent
Yamazaki et al.

(10) Patent No.: US 7,923,719 B2
(45) Date of Patent: Apr. 12, 2011

(54) SEMICONDUCTOR MEMORY DEVICE WHEREIN WIRING CONTACT IS MADE THROUGH AN OPENING IN AN ORGANIC COMPOUND LAYER

(75) Inventors: Shunpei Yamazaki, Setagaya (JP); Kiyoshi Kato, Atsugi (JP); Ryoji Nomura, Yamato (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 511 days.

(21) Appl. No.: 11/790,348

(22) Filed: Apr. 25, 2007

(65) Prior Publication Data

US 2007/0254432 A1    Nov. 1, 2007

(30) Foreign Application Priority Data

Apr. 28, 2006   (JP) .................................. 2006-127124

(51) Int. Cl.
  *H01L 29/08*  (2006.01)
  *H01L 51/40*  (2006.01)
  *H01L 21/8242*  (2006.01)
(52) U.S. Cl. .............................. 257/40; 438/99; 438/253
(58) Field of Classification Search .................... 257/40, 257/314, 319, 320
  See application file for complete search history.

(56) References Cited

U.S. PATENT DOCUMENTS

| 6,947,321 | B2 | 9/2005 | Tanabe | |
| 2003/0183699 | A1* | 10/2003 | Masui | 235/492 |
| 2004/0164302 | A1* | 8/2004 | Arai et al. | 257/72 |
| 2006/0157691 | A1* | 7/2006 | Lee et al. | 257/40 |

FOREIGN PATENT DOCUMENTS

| JP | 2004-047791 | 2/2004 |
| WO | WO 2006/043573 | 4/2006 |

* cited by examiner

*Primary Examiner* — Marcos D Pizarro
*Assistant Examiner* — Raj Gupta
(74) *Attorney, Agent, or Firm* — Eric J. Robinson; Robinson Intellectual Property Law Office, P.C.

(57) ABSTRACT

In the present invention, a semiconductor device that has a nonvolatile memory element to which data can be written at times other than during manufacture and in which forgery and the like performed by rewriting of data can be prevented is provided. In addition, a semiconductor device in which a high level of integration is possible is provided. Furthermore, a semiconductor device in which miniaturization is possible is provided. In a semiconductor device having a memory element that includes a first conductive layer, a second conductive layer, and an organic compound layer interposed between the first conductive layer and the second conductive layer; the second conductive layer is connected to a wiring, formed in the same way as the first conductive layer is formed, through an opening formed in the organic compound layer.

25 Claims, 19 Drawing Sheets

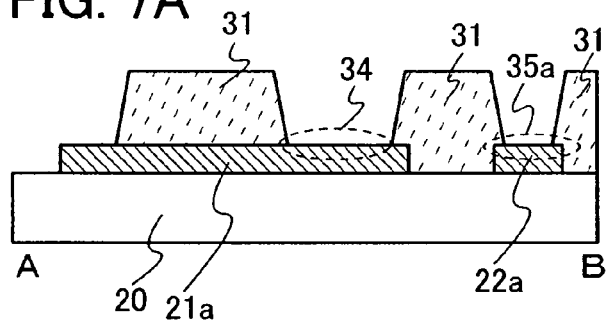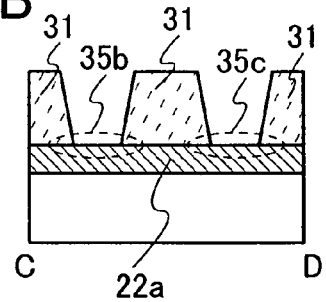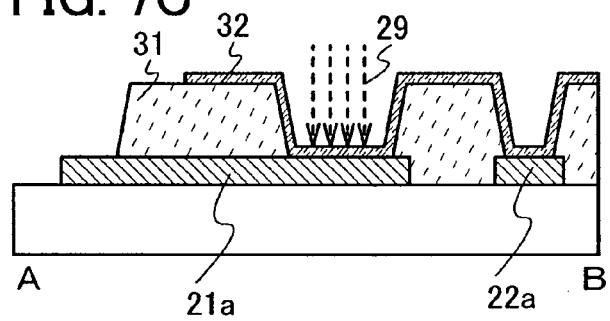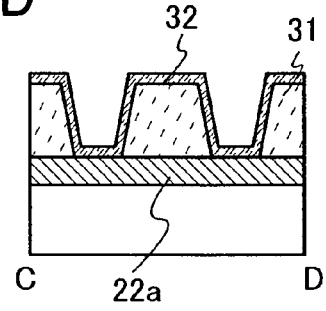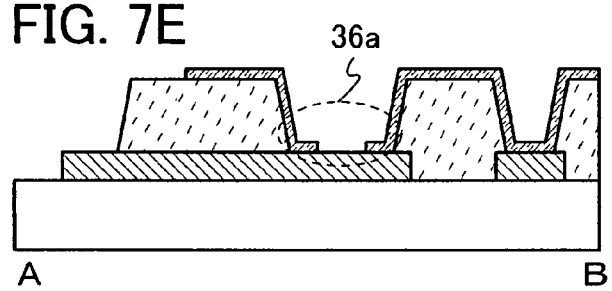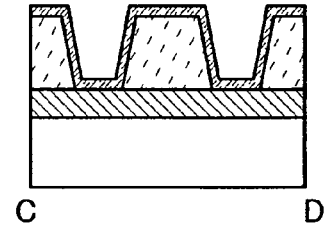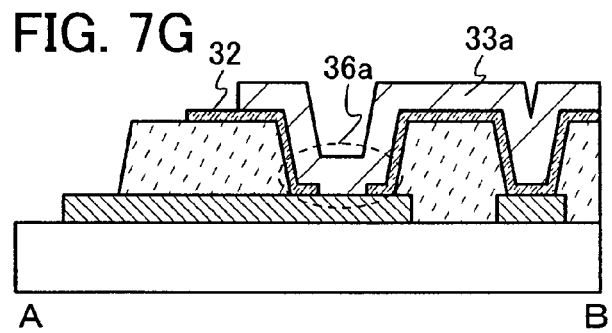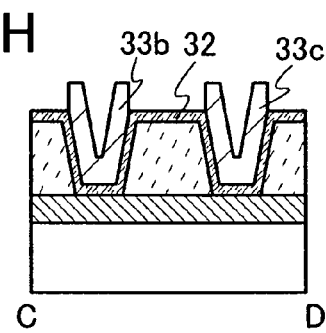

SEMICONDUCTOR MEMORY DEVICE WHEREIN WIRING CONTACT IS MADE THROUGH AN OPENING IN AN ORGANIC COMPOUND LAYER

BACKGROUND OF THE INVENTION

1. Field of the Invention

The present invention relates to a semiconductor device that includes a memory element formed using an organic compound.

2. Description of the Related Art

In recent years, development of a semiconductor device that has a variety of functions and in which a plurality of circuits are integrated over an insulating surface has been progressing. Furthermore, development of a semiconductor device in which data can be transmitted and received by wireless connection by provision of an antenna has been progressing. This kind of semiconductor device is referred to as a wireless chip (also referred to as an ID tag, an IC tag, an IC chip, an RF (Radio Frequency) tag, a wireless tag, an electronic tag, and RFID (Radio Frequency IDentification)) and has already been introduced into part of the marketplace.

Many of these semiconductor devices, which are now being put into practical use, include a circuit (also referred to as an IC (Integrated Circuit) chip) that has a semiconductor substrate of Si or the like and an antenna, and the IC chip includes a memory circuit (also referred to as memory), a control circuit, and the like. In particular, by provision of a memory circuit with which a lot of data can be stored, a semiconductor device with advanced function and high added value can be provided. In addition, having these semiconductor devices be manufactured at low cost is necessary, and, in recent years, development of organic thin film transistors, organic memory, and the like, which use organic compounds, used in control circuits, memory circuits, and the like, is actively being carried out (for an example of this, refer to Patent Document 1: Japanese Published Patent Application No. 2004-47791).

SUMMARY OF THE INVENTION

For memory circuits, DRAM (Dynamic Random Access Memory) circuits, SRAM (Static Random Access Memory) circuits, FeRAM (Ferroelectric Random Access Memory) circuits, mask ROM (Read Only Memory) circuits, EPROM (Electrically Programmable Read Only Memory) circuits, EEPROM (Electrically Erasable and Programmable Read Only Memory) circuits, flash memory circuits, and the like can be given. Out of these, DRAM circuits and SRAM circuits are volatile memory circuits; because data is erased when the power is turned off, data must be written each time the power is turned on. Although FeRAM circuits are nonvolatile memory circuits, because they use storage capacitors that contain ferroelectric layers, the number of manufacturing steps is increased. Although Mask ROM circuits have simple structures, because data must be written during the manufacturing process, new data cannot be added. Although EPROM circuits, EEPROM circuits, and flash memory circuits are nonvolatile memory circuits, because each element includes two gate electrodes, the number of manufacturing steps is increased.

Meanwhile, when a semiconductor device is manufactured using a deposition method or sputtering method that uses a metal mask, a step for adjusting the alignment of the metal mask is used. In general, for a method like a photolithography process or a laser ablation method, precision for alignment adjustment is high at around several micrometers, and a margin for adjusting the alignment need not be considered so much. However, for a deposition method or sputtering method that uses a metal mask, precision for alignment adjustment is low; furthermore, wraparound of the metal mask part at the time of layer formation needs to be considered, and a margin of from several tens of micrometers to several hundreds of micrometers must be maintained. For this reason, manufacturing an element and the like that has a detailed structure is difficult, and miniaturization, reduction in weight, and a shift to high performance of a semiconductor device are difficult to obtain, as well.

In consideration of the above problems, in the present invention, a semiconductor device that has a nonvolatile memory element to which data can be written at times other than during manufacture and in which forgery and the like performed by rewriting of data can be prevented is provided. In addition, a semiconductor device in which a high level of integration is possible is provided. Furthermore, a semiconductor device in which miniaturization is possible is provided.

One aspect of the present invention is a semiconductor device including a memory element that includes a first conductive layer, a second conductive layer, and an organic compound layer interposed between the first conductive layer and the second conductive layer, where the second conductive layer is connected to a wiring through an opening formed in the organic compound layer.

Another aspect of the present invention is a semiconductor device including a memory element that includes a first conductive layer, a second conductive layer, and an organic compound layer interposed between the first conductive layer and the second conductive layer, where the second conductive layer is connected to a first wiring and a second wiring through an opening formed in the organic compound layer.

It is to be noted that the wiring and the first conductive layer come into contact with the same insulating layer or insulating substrate. In addition, the wiring is formed at the same time as the first conductive layer is formed. Furthermore, the above-mentioned wiring is formed of the same materials of which the first conductive layer is formed.

It is to be noted that the abovementioned wiring is formed in the periphery of the first conductive layer. In addition, when the first conductive layer is looked down upon from above, it becomes apparent that the first conductive layer is located between a peripheral region in which lies the first wiring and a peripheral region in which lies the second wiring.

Another aspect of the present invention is a manufacturing method of a semiconductor device which includes the following steps: forming a first conductive layer and a wiring; forming an organic compound layer over the first conductive layer and the wiring; removing part of the organic compound layer; exposing part of the wiring; and forming a second conductive layer that is connected to the wiring.

Another aspect of the present invention is a manufacturing method of a semiconductor device which includes the following steps: forming a first conductive layer and a wiring; forming an organic compound layer over the first conductive layer and the wiring; forming a second conductive layer over the organic compound layer; irradiating the second conductive layer with a laser beam; and connecting the second conductive layer to the wiring.

Another aspect of the present invention is a manufacturing method of a semiconductor device which includes the following steps: forming a first conductive layer, a first wiring, and a second wiring; forming an organic compound layer over the first conductive layer, the first wiring, and the second wiring; forming a second conductive layer over the organic compound layer; applying a voltage to the second conductive layer, and electrically connecting the first wiring and the second wiring through the second conductive layer.

In the present invention, by provision of a memory element that includes an organic compound layer, data can be written at times other than during manufacture, and a semiconductor device that includes a nonvolatile memory element in which forgery and the like performed by rewriting of data can be prevented can be obtained. In addition, by connection of a wiring and a second conductive layer through an opening in an organic compound layer, a high level of integration can be obtained. Consequently, a semiconductor device that can be miniaturized can be obtained.

BRIEF DESCRIPTION OF THE DRAWINGS

FIGS. 7A to 7H are cross-sectional diagrams used to explain a manufacturing process of a semiconductor device of the present invention.

DETAILED DESCRIPTION OF THE INVENTION

Figure 1A:
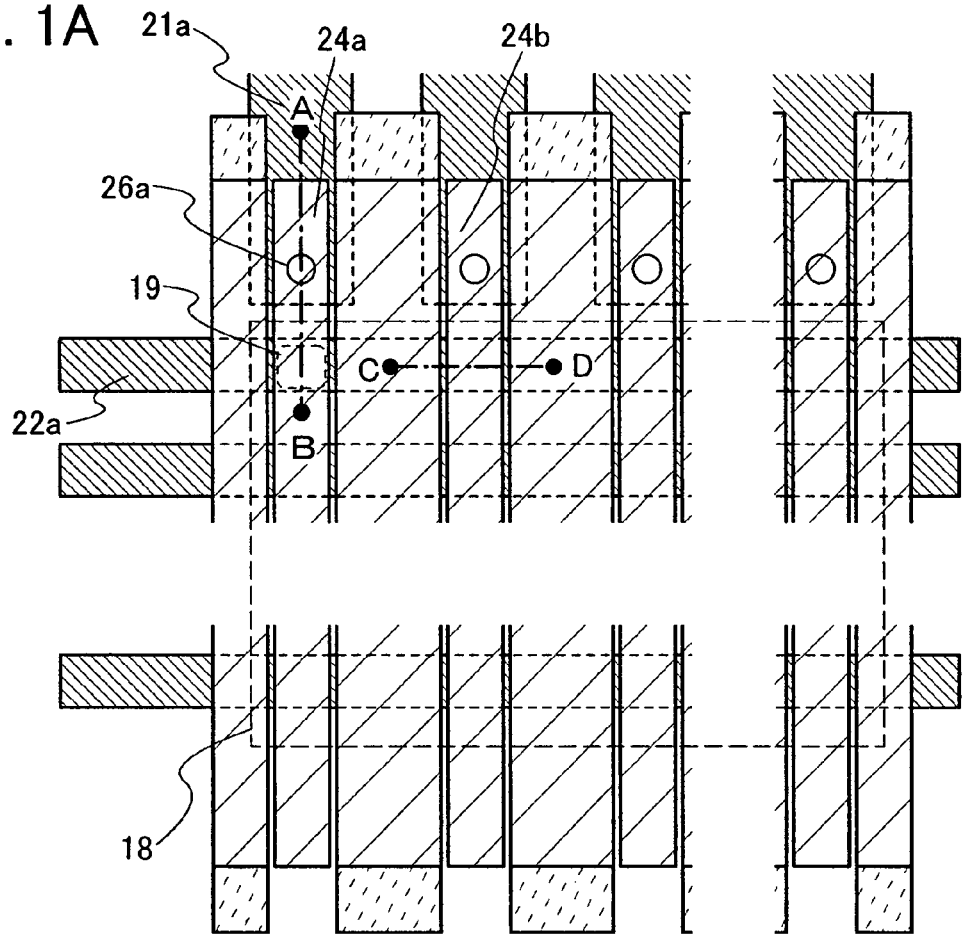
FIGS. 1A to 1C are top-view and cross-sectional diagrams used to explain a semiconductor device of the present invention.

Embodiment Modes of the present invention will be explained below with reference to the accompanying drawings. However, the present invention can be carried out in a variety of modes, and it is to be easily understood by those skilled in the art that modes and details of the present invention can be modified in a variety of ways without any departure from the purpose and scope of the present invention. Therefore, the present invention should not be interpreted as being limited to the embodiment modes described herein. Note that identical portions or portions having the same function in all figures used to explain embodiment modes are denoted by the same reference numerals and detailed descriptions thereof are omitted.

Embodiment Mode 1

In the present embodiment mode, the main structure of a semiconductor device of the present invention will be presented. FIGS. 1A to 1C, FIGS. 2A to 2H, and FIGS. 3A to 3H will be used to explain a memory cell array in which memory cells, each including a memory element that includes, typically, a first conductive layer, an organic compound layer, and a second conductive layer, are arranged in matrix. FIG. 1A shows a top view of a memory cell array, FIG. 1B shows a cross-sectional view of the memory cell array of a cross section taken along A-B in FIG. 1A, and FIG. 1C shows a cross-sectional view of the memory cell array of a cross section taken along C-D in FIG. 1A.

It is to be noted that, here, the first conductive layer 22a extends in the first direction, the second conductive layer 24a extends in the second direction, which intersects with the first direction, and the wiring 21a is formed on the outer side of the plurality of the first conductive layers; however, instead of this, the first conductive layer, the second conductive layer, and the wiring may be formed so that the first conductive layer extends in the second direction, the second conductive layer extends in the first direction, and the wiring is formed on the outer side of the plurality of the first conductive layer.

In a memory cell array 18, a memory cell 19 is provided in a matrix (refer to FIG. 1A). The memory cell 19 has a memory element 10a (refer to FIG. 1B). The memory element 10a includes a first conductive layer 22a extending in a first direction, an organic compound layer 23a that covers the first conductive layer 22a, and a second conductive layer 24a extending in a second direction that intersects with the first direction, each of which is formed over a substrate 20. In addition, a wiring 21a, formed at the same time as the first conductive layer 22a is formed, is formed on the outer side of a plurality of first conductive layers. That is, the first conductive layer 22a and the wiring 21a are in contact with the same substrate 20. In addition, an insulating layer that functions as a protective layer may be formed to cover the second conductive layer 24a.

Figure 1B:
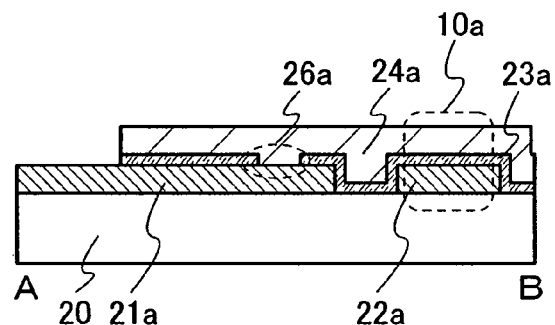
Figure 1C:
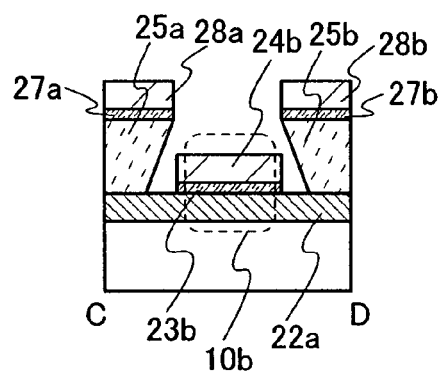

In FIG. 1B, a cross-sectional structure of a wiring and a memory cell array is shown.

The wiring 21a and the first conductive layer 22a are formed over the substrate 20. The organic compound layer 23a is formed over the substrate 20, the wiring 21a, and the first conductive layer 22a. In addition, the second conductive layer 24a is formed over the organic compound layer 23a and part of the wiring 21a. The second conductive layer 24a is connected to the wiring 21a through an opening 26a in the organic compound layer 23a.

In FIG. 1C, a cross-sectional structure of a memory cell array is shown. It is to be noted that the cross-sectional structure shown in FIG. 1C is taken along a direction perpendicular to the direction from which the structure in FIG. 1B is taken.

The first conductive layer 22a is formed over the substrate 20. The organic compound layer 23b and insulating layers 25a and 25b that function as partition walls are formed over the first conductive layer 22a. In addition, an organic compound layer 27a and an organic compound layer 27b are formed over the insulating layer 25a that functions as a partition wall and the insulating layer 25b that functions as a partition wall, respectively. It is to be noted that the organic compound layer 23b and the organic compound layers 27a and 27b are separated so that they are insulated from each other. A second conductive layer 24b is formed over the organic compound layer 23b. In addition, second conductive layers 28a and 28b are formed over the organic compound layers 27a and 27b. A memory element 10b is formed of the first conductive layer 22a, the organic compound layer 23b, and the second conductive layer 24b.

For the substrate 20, in addition to use of a glass substrate or a flexible substrate, a quartz substrate, a silicon substrate, a metal substrate, a stainless steel substrate, paper formed of a fibrous material, or the like can be used. The flexible substrate is a substrate which can be bent (is flexible), and, as an example, a plastic substrate or the like made using polycarbonate, polyarylate, polyethersulfone, or the like can be given. Alternatively, a layer that has a thermoplastic layer (a layer made using polypropylene, polyester, vinyl, polyvinyl fluoride, polyvinyl chloride, or the like) can be used.

For each of the first conductive layer 22a, the wiring 21a, and the second conductive layer 24a, a single-layer or multilayer structure made of a metal, an alloy, a compound, or the like, which has high conductivity, can be used. Typically, it is possible to use a metal, an alloy, or a conductive compound with a high work function (specifically, a work function greater than or equal to 4.0 eV) or a combination of any of these, or a metal, an alloy, or a conductive compound with a low work function (specifically, a work function less than or equal to 3.8 eV) or a combination of any of these.

For typical examples of metals, alloys, and conductive compounds that have high work functions (specifically, a work function greater than or equal to 4.0 eV), indium tin oxide (hereinafter referred to as ITO), ITO that contains silicon, indium oxide that contains from 2% to 20% of zinc oxide (ZnO), and the like can be given. In addition, titanium (Ti), gold (Au), platinum (Pt), nickel (Ni), tungsten (W), chromium (Cr), molybdenum (Mo), iron (Fe), cobalt (Co), copper (Cu), palladium (Pd), a nitride of a metal material, (for example, titanium nitride (TIN), tungsten nitride (WN), or molybdenum nitride (MoN)), can be used, as well.

For typical examples of metals, alloys, and conductive compounds that have low work functions (specifically, a work function less than or equal to 3.8 eV), a metal belonging to group 1 or group 2 of the periodic table, that is, an alkali metal, such as lithium (Li), cesium (Cs), or the like, or an alkali earth metal, such as magnesium (Mg), calcium (Ca), strontium (Sr), or the like; an alloy containing one or more of any of these alkali and alkali earth metals (MgAg, AlLi); a rare earth metal such as europium (Er), ytterbium (Yb), and the like; and an alloy containing one or more of these rare earth metals; and the like can be given.

It is to be noted that, in the first conductive layer 22a or in the second conductive layer 24a, when an electrode, that is, an anode, is used to inject holes into the organic compound layers 23a, 23b, 27a, and 27b, using an electrode that has a high work function is preferable. Conversely, when an electrode is used to inject electrons into the organic compound layers 23a, 23b, 27a, and 27b, using an electrode that has a low work function is preferable.

The organic compound layers 23a, 23b, 27a, and 27b are formed of an organic compound whose crystal states, conductivity, and shape are changed by a voltage applied to the first conductive layer 22a and the second conductive layer 24a. The organic compound layers 23a, 23b, 27a, and 27b may each be formed as a single layer or as a plurality of stacked layers formed of different organic compounds.

It is to be noted that the organic compound layers 23a and 23b are each formed at a film thickness at which the electrical resistance of a memory element changes due to application of a voltage from an external source. Typical film thickness for each of the organic compound layers 23a and 23b is from 5 nm to 100 nm, preferably, from 10 nm to 60 nm.

In addition, the organic compound layers 23a, 23b, 27a, and 27b may be formed using an organic compound that has a hole transporting property or using an organic compound that has an electron transporting property.

For an organic compound that has a hole transporting property, an aromatic amine type compound (that is, a compound that contains a benzene ring-nitrogen bond) such as 4,4'-bis [N-(1-naphthyl)-N-phenyl-amino]-biphenyl (abbreviation: NPB), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris [N-(3-methylphenyl)-N-phenyl-amino]-triphenylamine (abbreviation: MTDATA), 4,4'-bis(N-(4-(N,N-di-m-tolylamino)phenyl)-N-phenylamino)biphenyl (abbreviation: DNTPD), or the like; or a phthalocyanine compound such as phthalocyanine (abbreviation: $H_2PC$), copper phthalocyanine (abbreviation: CuPC), vanadyl phthalocyanine (abbreviation: VOPC), or the like can be used. The substances given here are mainly substances that each have a hole mobility of $10^{-6}$ $cm^2/(V.s)$ or more.

For an organic compound that has an electron transporting property, a material made from a metal complex or the like that has a quinoline skeleton or a benzoquinoline skeleton, such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)-4-phenylphenolato-aluminum (abbreviation: BAlq), or the like, can be used. Alternatively, a material, such as bis[2-(2'-hydroxyphenyl)benzoxazolato]zinc (abbreviation: $Zn(BOX)_2$), bis [2-(2'-hydroxyphenyl)benzothiazolato]zinc (abbreviation: $Zn(BTZ)_2$), or the like, made from a metal complex that has an oxazole-based or a thiazole-based ligand, or the like can also be used. Furthermore, in addition to metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or the like can be used. The materials given here are mainly materials that each has an electron mobility of $10^{-6}$ $cm^2/(V.s)$ or more.

In addition, in order to change the hole-transporting properties or electron-transporting properties of the organic compound layers 23a, 23b, 27a, and 27b, the organic compound layers 23a, 23b, 27a, and 27b may be formed using a plurality of organic compounds that have different electric charge transporting properties. These kinds of organic compound layers can be formed by codeposition of organic compounds that have different electric charge transporting properties.

In addition, in order to change the hole-transporting properties or electron-transporting properties of the organic compound layers 23a, 23b, 27a, and 27b, the organic compound layers 23a, 23b, 27a, and 27b may be formed of an organic compound and an insulator. These kinds of organic compound layers can be formed by codeposition of an organic compound and an inorganic compound, by addition of an inorganic compound to an organic compound, of a stacked structure of an organic compound layer and an inorganic compound layer, or the like. For inorganic compounds, there are insulators and semiconductors. For an inorganic compound that has an insulating property, there are an oxide that has an insulating property, typified by MgO, CaO, SrO, BaO, $Sc_2O_3$, $ZrO_2$, $Fe_2O_3$, CoO, PdO, $Ag_2O$, $Al_2O_3$, and the like; a fluoride that has an insulating property, typified by LiF, KF, $CaF_2$, and the like; a chloride that has an insulating property, typified by LiCl, NaCl, KCl, $BeCl_2$, $CaCl_2$, $BaCl_2$, and the like; a bromide that has an insulating property, typified by KBr, CsBr, AgBr, and the like; an iodide that has an insulating property, typified by NaI, KI, $BaI_2$, and the like; a carbonate that has an insulating property, typified by $MgCO_3$, $CaCO_3$, $SrCO_3$, $BaCO_3$, $MnCO_3$, $FeCO_3$, $CoCO_3$, and the like; a sulfate that has an insulating property, typified by $Li_2SO_4$, $K_2SO_4$, $Na_2SO_4$, $MgSO_4$, $CaSO_4$, $SrSO_4$, $BaSO_4$, and the like; and a nitride that has an insulating property, typified by AlN, SiN, and the like. In addition, for an inorganic compound representing a semiconductor, there are molybdenum oxide, tin oxide, bismuth oxide, a silicon film, vanadium oxide, nickel oxide, zinc oxide, silicon germanium, gallium arsenide, gallium nitride, indium oxide, indium phosphide, indium nitride, cadmium sulfide, cadmium telluride, a strontium titanate film, and the like.

In the present embodiment mode, it is preferable that the shape of each of the insulating layers 25a and 25b that function as partition walls be an inverted trapezoidal shape in which the length of the upper base in a cross-section is longer than the length of the lower base. In addition, it is preferable that the insulating layers 25a and 25b be formed into a striped shape in a second direction in which a second conductive layer is formed. With the shapes being made in this way, when an organic compound layer and a second conductive layer are formed, an organic compound layer and a second conductive layer formed in a region over the insulating layers 25a and 25b and an organic compound layer and a second conductive layer formed in a region over the first conductive layer 22a can be isolated into the striped shape automatically. For this reason, the number of steps for manufacturing an organic compound layer and a second conductive layer can be reduced.

The insulating layers 25a and 25b that function as partition walls are formed using an organic resin such as polyimide, polyethylene, polypropylene, a polystyrene resin, an epoxy resin, an acrylic resin, or the like or an organic compound.

It is to be noted that, in addition to a memory element 10, it is preferable that an element that has a rectifying property be provided in the memory cell 19. For the element that has a rectifying property, there are a transistor in which a gate electrode and drain electrode are connected, a diode, and the like. For typical examples of the diode, a P-N junction diode, a diode that has a PIN junction, an avalanche diode, and the like can be given. In addition, a diode with a different kind of structure may be used. An element that has a rectifying property can be provided between the substrate 20 and the first conductive layer 22a. Alternatively, the element that has a rectifying property can be provided on a side opposite from the organic compound layers 23a and 23b with the second conductive layer interposed between the element that has a rectifying property and the organic compound layers 23a and 23b. In addition, the element that has a rectifying property can be provided between the organic compound layers 23a and 23b and the first conductive layer 22a. Furthermore, the element that has a rectifying property can be provided between the organic compound layers 23a and 23b and the second conductive layer 24a. In this way, by provision of the element that has a rectifying property, current can only flow in one direction, whereby reading errors can be reduced.

When a first conductive layer, an organic compound layer, a second conductive layer, and a wiring that make up a memory element are formed, and in the case when the organic compound layer and the second conductive layer are formed using metal masks, in consideration of precision in alignment of the metal mask and wraparound during layer formation, design of a layout in which a uniform margin is considered is necessary.

Figure 18:
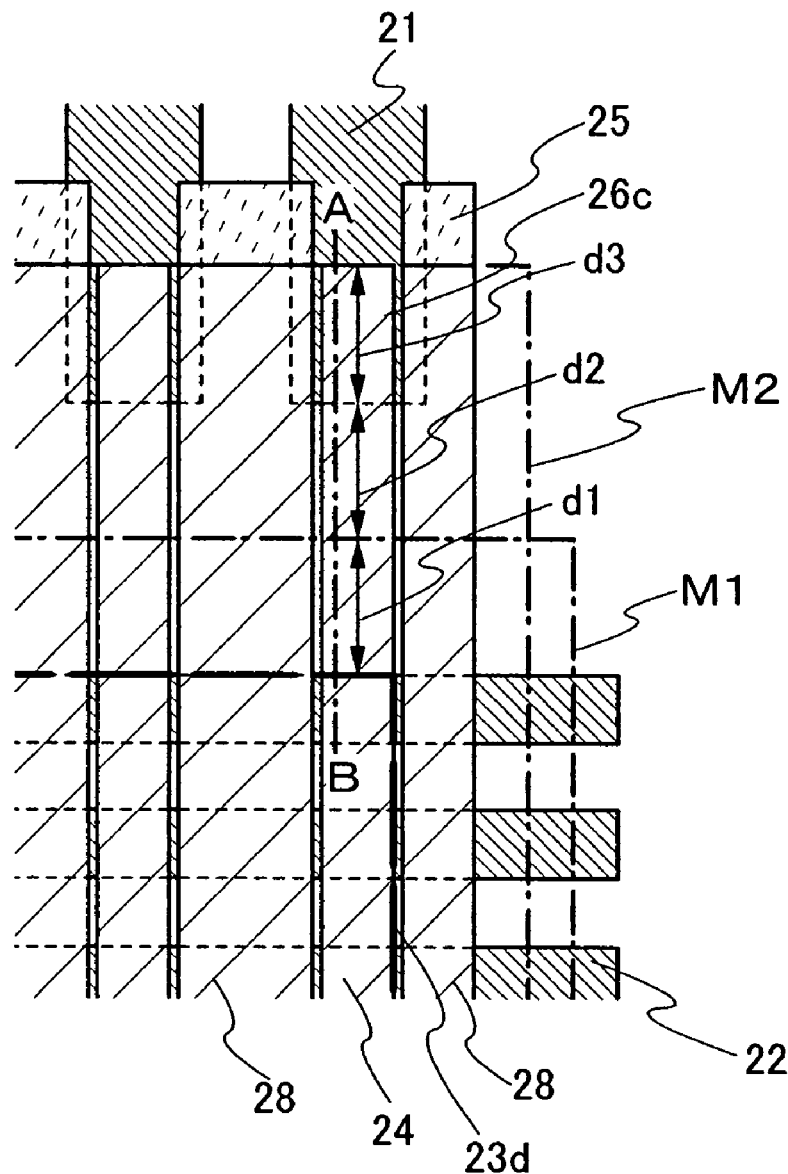
FIG. 18 is a top-view diagram used to explain a conventional semiconductor device.
Figure 19A:
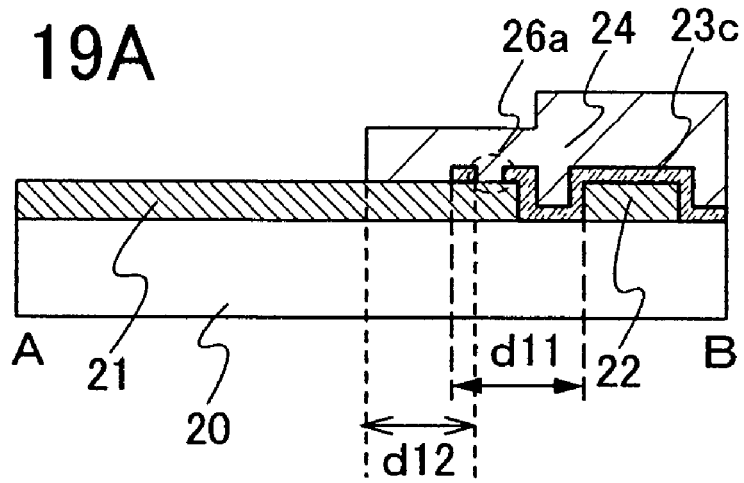
FIGS. 19A to 19C are cross-sectional diagrams used to explain a semiconductor device of the present invention and a conventional semiconductor device.
Figure 19B:
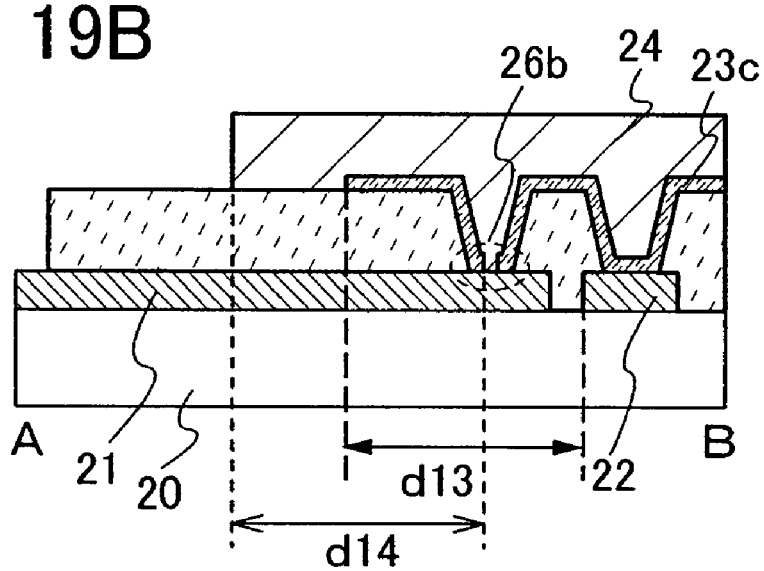
Figure 19C:
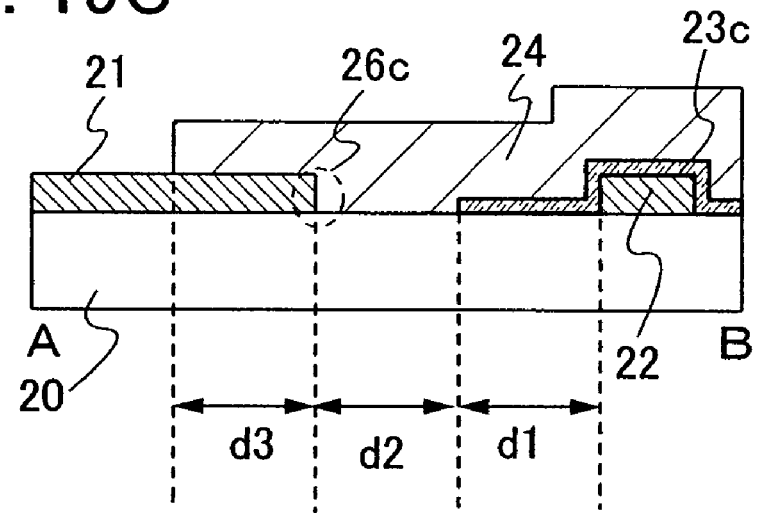

FIG. 18 illustrates a top view of an edge of a memory cell array that forms a conventional memory element, and FIG. 19C illustrates a cross-sectional view of a cross section taken along A-B in FIG. 18. In FIG. 18, in order that separation be performed in the direction in which a plurality of second conductive layers 24 intersect with a first conductive layer 22, a reverse trapezoidal-shaped interlayer insulating layer 25 is provided in a direction of intersection of the first conductive layer 22. In addition, over the interlayer insulating layer 25, an organic compound layer and a conductive layer 28 formed at the same time as the second conductive layer 24 is formed are provided.

If the layout is designed such that a wiring 21 and the second conductive layer 24 are made to be connected to each other with no organic compound layer provided therebetween, when an organic compound layer that covers the first conductive layer 22 is formed, upon consideration of misalignment of a metal mask for forming a organic compound layer 23c, a margin d1 is needed.

In addition, in order that an organic compound layer 23c not be formed in a region in which the wiring 21 and the second conductive layer 24 are connected, upon consideration of misalignment of a metal mask for forming the organic compound layer 23c, a margin d2 is needed.

Furthermore, when the second conductive layer 24 that connects to the wiring 21 is formed, upon consideration of misalignment of a metal mask for forming the second conductive layer 24, a margin d3 from an edge 26c connecting the wiring 21 and the second conductive layer 24 is needed.

It is to be noted that a dashed line 23d is used to indicate a region in which an organic compound layer must be formed at minimum, a dashed line M1 is used to indicate a region in which an opening of a metal mask used for forming an organic compound layer can be designed, and a dashed line M2 is used to indicate a region in which an opening of a metal mask used for forming the second conductive layer 24 can be designed.

Figure 17A:
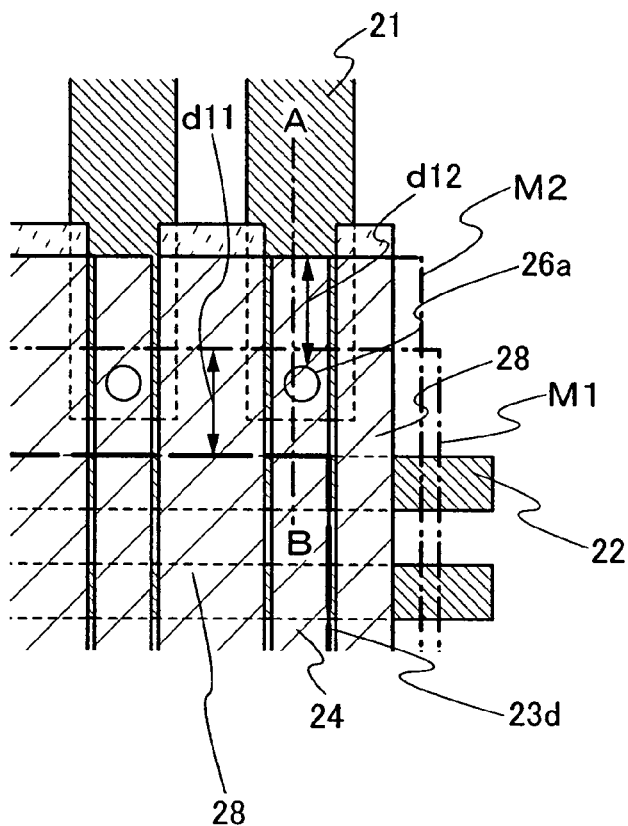
FIGS. 17A and 17B are top-view diagrams used to explain a semiconductor device of the present invention.
Figure 17B:
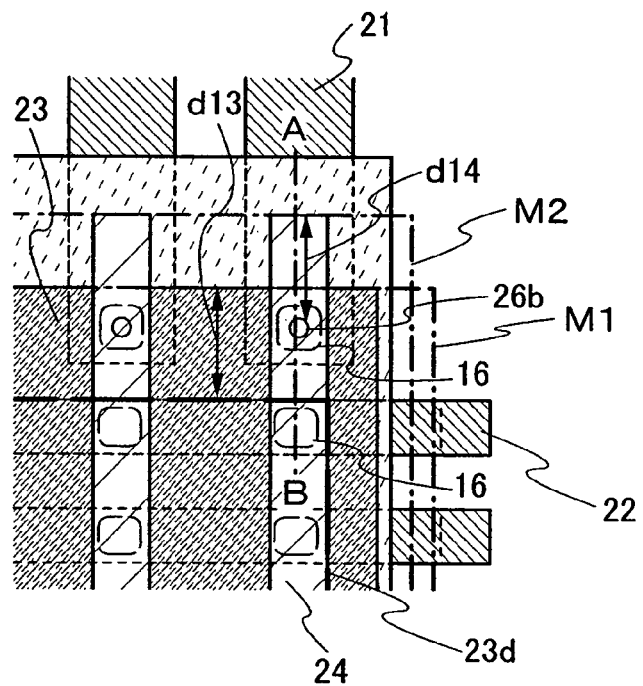

However, as in the present invention shown in FIGS. 17A and 17B, in an opening 26a formed in an organic semiconductor layer 23c, a wiring 21 and a second conductive layer 24 are made to be connected, whereby a margin for a metal mask can be reduced.

In FIGS. 17A and 17B, a top view of an edge of a memory cell array forming a memory element of the present invention is shown, FIG. 19A shows a cross-sectional view of a cross section taken along A-B in FIG. 17A, and FIG. 19B shows a cross-sectional view of a cross section taken along A-B in FIG. 17B. In FIG. 17A, as in FIG. 18, in order that separation be performed in the direction in which a plurality of second conductive layers 24 intersects with a first conductive layer 22, a reverse trapezoidal-shaped interlayer insulating layer (not shown) is provided in a direction of intersection of the first conductive layer 22. In addition, over the interlayer insulating layer, an organic compound layer, formed at the same time as an organic compound layer 23c is formed, and a conductive layer 28, formed at the same time as the second conductive layer 24 is formed, are provided.

As shown in FIG. 17A, when an organic compound layer 23c covering the first conductive layer 22 is formed, upon consideration of misalignment of a metal mask for forming the organic compound layer 23c, a margin d11 (equivalent to the margin d1 in FIG. 18) is needed. In addition, when the second conductive layer 24 is formed in an opening 26a, upon consideration of misalignment of a metal mask for forming the second conductive layer 24, a margin d12 is needed.

Furthermore, in order that the wiring 21 and the first conductive layer 24 be connected unfailingly, an opening 26a is provided, and, in the region, the wiring 21 and the second conductive layer 24 are connected.

However, because an organic compound layer is not formed, in a region in which a wiring 21 and the second conductive layer 24 are connected (in FIG. 17A, the opening 26a), the margin d2 is not needed which differs form the aforementioned conventional example shown in FIG. 18.

Moreover, the opening 26a can be formed using a photolithography process or laser ablation, each of which has a high level of alignment precision. For this reason, the wiring 21 can be formed in close proximity to the first conductive layer 22. As a result of this, the region in which the wiring 21 and the second conductive layer 24 are connected can be brought closer to the memory cell array.

A cross section has a sequential tapered shape (that is, a trapezoidal shape in which the upper base of the cross section is shorter than the lower base) and formed over nearly the entire surface of a substrate, and a case in which an interlayer insulating layer 15 that has an opening 16 that exposes part of a wiring 21 and an opening 16 that exposes part of the first conductive layer 22 is formed will be explained with reference to FIG. 17B and FIG. 19B.

When an organic compound layer 23c is formed over a first conductive layer 22, upon consideration of misalignment of a metal mask for forming the organic compound layer 23c, a margin d13 (equivalent to the margin d1 in FIG. 18) is needed.

In addition, when a second conductive layer 24 is formed in an opening 26b, upon consideration of misalignment of a metal mask for forming the second conductive layer 24, a margin d14 is needed. Additionally, in order that a wiring 21 and the second conductive layer 24 be connected most assuredly, in the region in which the opening 26b is formed, the wiring 21 and the second conductive layer 24 are connected.

However, because the organic compound layer 23c is not formed, in a region in which the wiring 21 and the second conductive layer 24 are connected (in FIG. 17B, the opening 26b), the margin d2 is not needed which differs from the aforementioned conventional example shown in FIG. 18.

Moreover, the opening 26b can be formed using a photolithography process or laser ablation, each of which has a high level of alignment precision. For this reason, the wiring 21 can be formed in close proximity to the first conductive layer 22. As a result of this, the region in which the wiring 21 and the second conductive layer 24 are connected can be brought closer to the memory cell array.

Taking a structure like the one of the present invention, a region in which a second conductive layer 24 and a wiring 21 are connected can be brought closer to a memory cell array, and a semiconductor device can be miniaturized. In addition, a semiconductor device in which, for an area the same size as the area of a conventional structure, more memory elements can be integrated into a memory circuit and in which the amount of information that can be recorded is increased can be manufactured.

Next, a manufacturing method of a semiconductor device described in this embodiment mode will be explained using FIGS. 2A to 2H and FIGS. 3A to 3H.

FIGS. 2A, 2C, 2E, and 2G show a manufacturing process of A-B in FIG. 1B, and FIGS. 2B, 2D, 2F, and 2H show a manufacturing process of C-D in FIG. 1C.

Figure 2A:
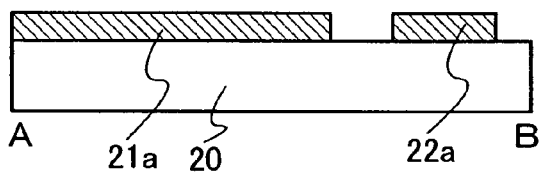
FIGS. 2A to 2H are cross-sectional diagrams used to explain a manufacturing process of a semiconductor device of the present invention.
Figure 2B:
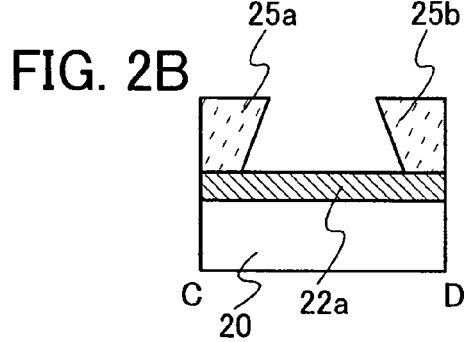

As shown in FIGS. 2A and 2B, a first conductive layer 22a and a wiring 21a are formed over a substrate 20, and insulating layers 25a and 25b that function as partition walls are formed over the first conductive layer 22a and the wiring 21a.

The first conductive layer 22a and the wiring 21a are formed of conductive layers using a vapor deposition method, a sputtering method, a CVD method, a printing method, an electrolytic plating method, a nonelectrolytic plating method, a droplet discharge method, or the like. It is to be noted that, here, a droplet discharge method is a method in which droplets of a composition that contains fine particles are discharged through a minute hole and formed into a pattern with a predetermined shape.

Here, after a titanium layer from 50 nm to 200 nm thick is formed by a sputtering method, the titanium layer is etched into a desired shape to form the first conductive layer 22a and the wiring 21a.

The insulating layers 25a and 25b that function as partition walls can be formed using a dry etching method, a wet etching method, or the like. In addition, when the insulating layers 25a and 25b are formed using a photosensitive resin, the insulating layers 25a and 25b can be formed using a photolithography process or the like. It is to be noted that it is preferable to form the insulating layers 25a and 25b that function as partition walls in a direction of intersection with the first conductive layer 22a.

Figure 2C:
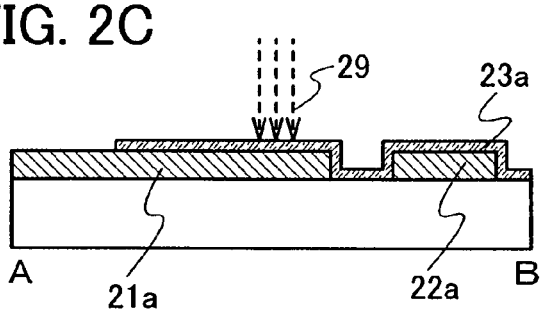
Figure 2D:
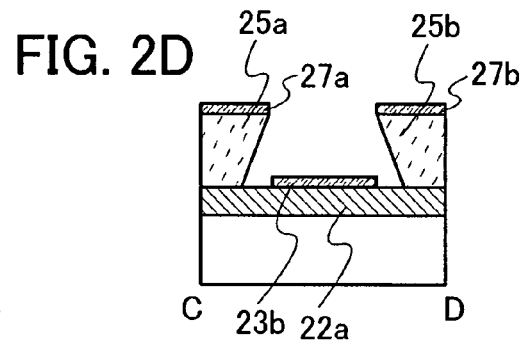

Next, as shown in FIGS. 2C and 2D, organic compound layers 23a and 23b are formed over the substrate 20, the wiring 21a, and the first conductive layer 22a. It is to be noted that, in the present embodiment mode, because the cross section of each of the insulating layers 25a and 25b that function as partition walls is a trapezoidal shape, when organic compound layers are formed, the organic compound layers are formed over the insulating layers 25a and 25b that function as partition walls as well as between the insulating layers 25a and 25b that function as partition walls. That is, the organic compound layer 23a formed over the substrate 20 and the first conductive layer 22a is separated from organic compound layers 27a and 27b formed over the insulating layers 25a and 25b and also formed in a direction of intersection with the first conductive layer 22a.

The organic compound layers 23a, 23b, 27a, and 27b can be formed using a vapor deposition method, an electron beam deposition method, a sputtering method, a CVD method, or the like. Alternatively, a spin coat method, a sol-gel method, a printing method, a droplet discharge method, or the like may be used, or a combination of one or more of any of the above methods may be used.

Here, after a tin oxide layer with a thickness of from 0.1 nm to 10 nm, preferably, from 1 nm to 5 nm, is formed by a vapor deposition method, the organic compound layers 23a, 23b, 27a, and 27b are formed using NPB with a thickness of from 5 nm to 50 nm, preferably, from 10 nm to 20 nm, by a vapor deposition method.

Figure 2E:
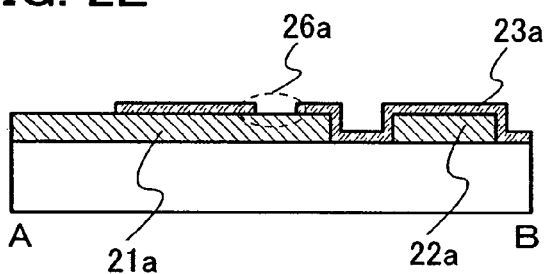
Figure 2F:
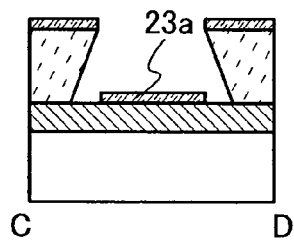

Next, the organic compound layer 23a is irradiated with a laser beam 29, part of the organic compound layer 23a is removed by laser ablation, and an opening 26a as shown in FIG. 2E is formed. It is to be noted that when the organic compound layer 23a is formed, by use of a mask with which the opening 26a can be formed, even if the process of irradiation with the laser beam 29 shown in FIG. 2C is not performed, the opening 26a can be formed.

Figure 2G:
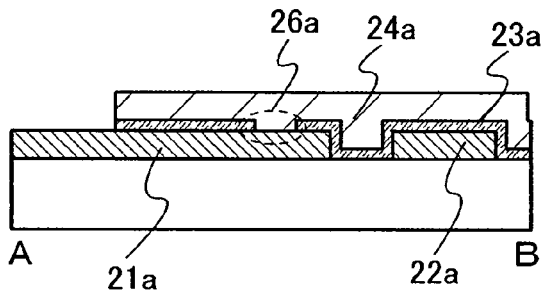
Figure 2H:
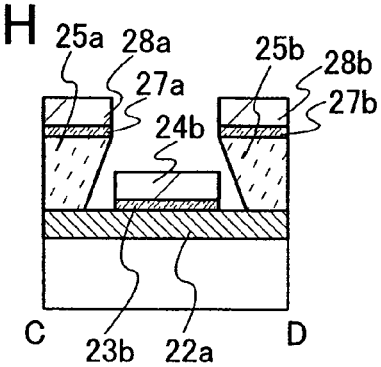

Next, as shown in FIGS. 2G and 2H, second conductive layers 24a and 24b are formed over the organic compound layers 23a and 23b, and second conductive layers 28a and 28b are formed over the organic compound layers 27a and 27b. In addition, for each of the second conductive layers 24a, 24b, 28a, and 28b, an aluminum layer with a thickness of from 50 nm to 200 nm is formed by a vapor deposition method.

Because the insulating layers 25a and 25b whose reverse-trapezoidal shaped cross sections function as partition walls are formed, the second conductive layers 24a and 24b are separated from the second conductive layers 28a and 28b formed over the organic compound layers 27a and 27b even if no mask is used, and the second conductive layers 24a and 24b can be formed in a direction of intersection with the first conductive layer 22a, as well.

Now, a manufacturing method of a semiconductor device which can be formed using a method different from the above method is shown in FIGS. 3A to 3H.

Figure 3A:
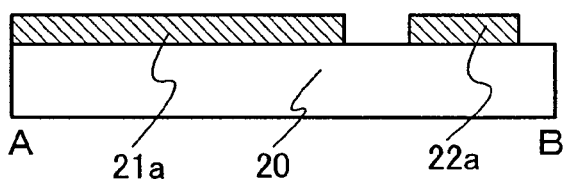
FIGS. 3A to 3H are cross-sectional diagrams used to explain a manufacturing process of a semiconductor device of the present invention.
Figure 3B:
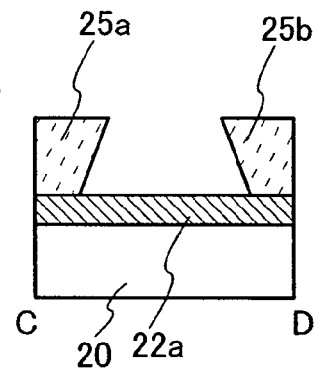

As shown in FIGS. 3A and 3B, as in FIGS. 2A and 2B, a first conductive layer 22a and a wiring 21a are formed over a substrate 20.

Figure 3C:
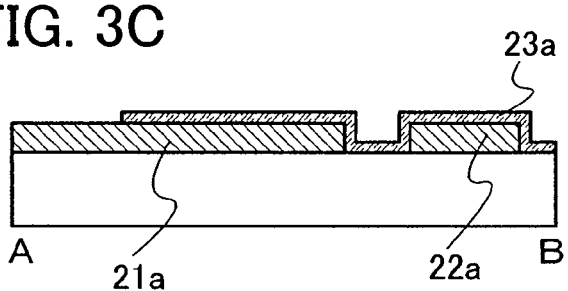
Figure 3D:
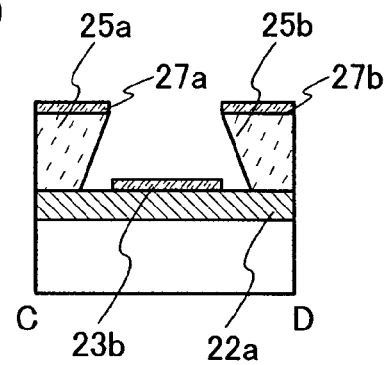

Next, as shown in FIGS. 3C and 3D, as in FIGS. 2C and 2D, organic compound layers 23a and 23b and insulating layers 25a and 25b that function as partition walls are formed over the first conductive layer 22a. Organic compound layers 27a and 27b are formed over the insulating layers 25a and 25b that function as partition walls.

Figure 3E:
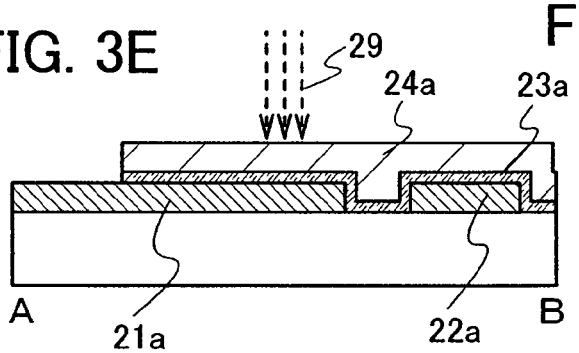
Figure 3F:
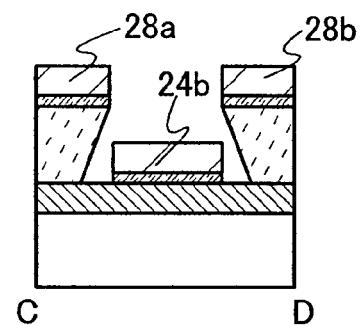
Figure 3G:
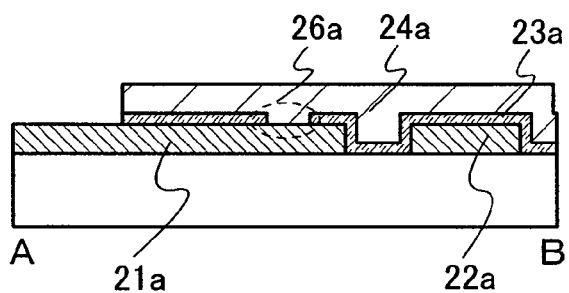
Figure 3H:
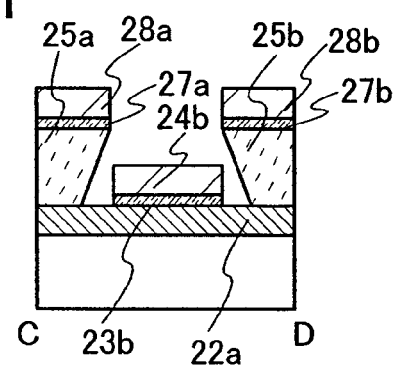

Next, as shown in FIGS. 3E and 3F, second insulating layers 24a, 24b, 28a, and 28b are formed over the organic compound layers 23a, 23b, 27a, and 27b. Next, a region in which the wiring 21a, the organic compound layer 23a, and the second conductive layer 24a overlap is irradiated with a laser beam 29, at least the organic compound layer 23a and the second conductive layer 24a are melted, and, as shown in FIG. 3G the wiring 21a and the second conductive layer 24a are connected.

At this time, the output of a laser is regulated so that the second conductive layer 24a is driven to the depth of the wiring 21a. Here, laser irradiation is performed using an Nd:YVO$_4$ pulse laser with a laser wavelength of 266 nm, an oscillating frequency of 15 kHz, and an average output of 3 W. These conditions are exemplified by merely typical conditions, but the present invention is not particularly limited to these conditions. By this laser irradiation, the second conductive layer 24a and the wiring 21a are electrically connected to each other, and a state like the one shown in FIG. 3G is obtained. Specifically, as shown in FIG. 3G, in a place that is irradiated with a laser beam, an opening 26a is formed in the organic compound layer 23a, and a condition is obtained in which the second conductive layer 24a penetrates through to the top surface of the wiring 21a along side wall portions of the opening 26a.

By performance of the above steps, in the opening 26a of the organic compound layer 23a, a second conductive layer 24a connected to the wiring 21a, which is formed at the same time as the first conductive layer 22a is formed, can be formed. In addition, a semiconductor device that is more miniaturized than a conventional semiconductor device can be manufactured. Furthermore, for a semiconductor device that has the same area as a conventional semiconductor device, a semiconductor device in which the amount of stored information is increased can be manufactured.

Embodiment Mode 2

In the present embodiment mode, a main structure of a semiconductor device in which a method for connecting a wiring and a second conductive layer differing from the method of the above embodiment mode is used will be explained using FIGS. 4A to 4C.

In the present embodiment mode, a memory cell array in which memory cells each having a first conductive layer, an organic compound layer, and a second conductive layer are arranged in matrix will be explained using FIGS. 4A to 4C and FIGS. 5A to 5E. FIG. 4A shows a top view of a memory cell array, FIG. 4B shows a cross-sectional view of a cross section taken along A-B and E-F in FIG. 4A, and FIG. 4C shows a cross-sectional view of a cross section taken along C-D in FIG. 4A. It is to be noted that, in the present embodiment mode, a first wiring is connected to one end of the second conductive layer, and a second wiring is connected to another end of the second conductive layer.

Figure 4A:
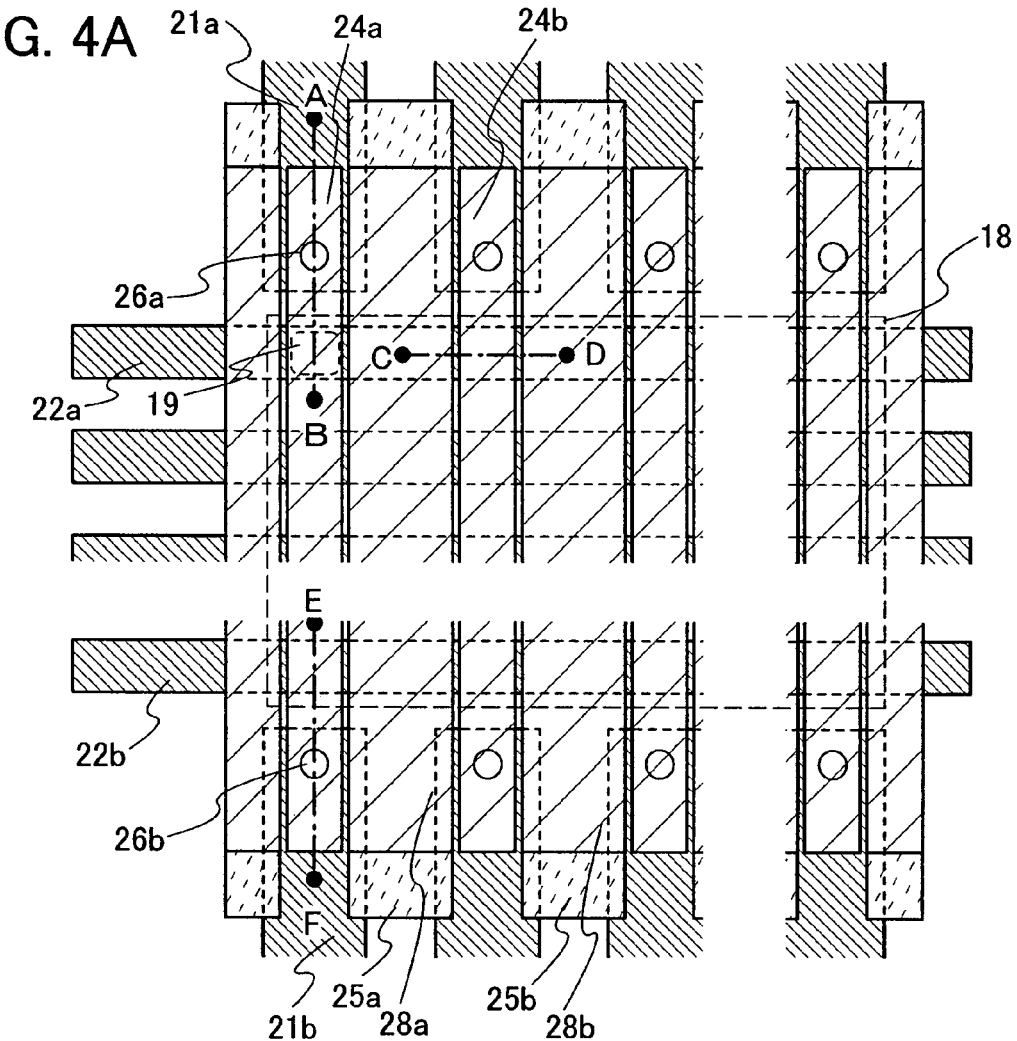
FIGS. 4A to 4C are top-view and cross-sectional diagrams used to explain a semiconductor device of the present invention.

In a memory cell array 18, a memory cell 19 is provided in a matrix (refer to FIG. 4A). The memory cell 19 has a memory element 10 (refer to FIG. 4B). The memory cell 10 has a first conductive layer 22a extending in a first direction, an organic compound layer 23a that covers the first conductive layer 22a, and a second conductive layer 24a extending in a second direction that intersects with the first direction formed over a substrate 20. In addition, wirings, formed at the same time as the first conductive layer is formed, are formed on the outer side of a plurality of the first conductive layers. That is, the first conductive layer, the first wiring, and the second wiring come into contact with the same substrate 20.

Figure 4B:
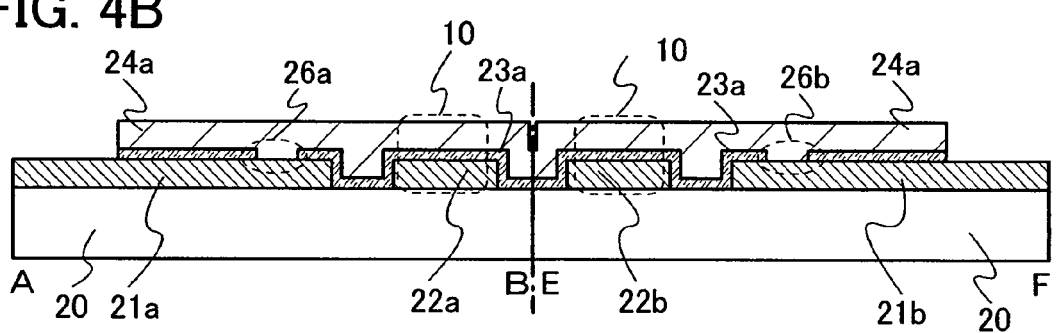

In FIG. 4B, a cross-sectional structure of a wiring and a memory cell array is shown.

In the region along A-B in FIG. 4B, a first wiring 21a and a first conductive layer 22a are formed over a substrate 20. An organic compound layer 23a is formed over the substrate 20, the first wiring 21a, and the first conductive layer 22a. In addition, over the organic compound layer 23a and part of the first wiring 21a, a second conductive layer 24a is formed. The second conductive layer 24a is connected to the first wiring 21a in an opening 26a of the organic compound layer 23a. Furthermore, in the region along E-F in FIG. 4B, a second wiring 21b and a first conductive layer 22b are formed over the substrate 20. An organic compound layer 23a is formed over the substrate 20, the second wiring 21a, and the first conductive layer 22b. Moreover, over the organic compound layer 23a and part of the second wiring 21b, a second conductive layer 24a is formed. The second conductive layer 24a is connected to the second wiring 21b in an opening 26b of the organic compound layer 23a. That is, the second conductive layer 24a is connected to the first wiring 21a and the second wiring 21b.

Figure 4C:
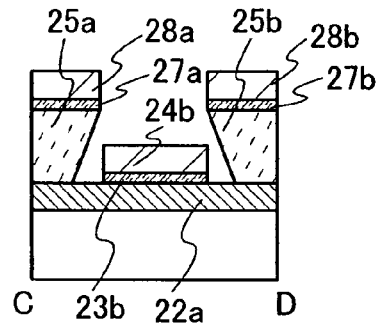

In FIG. 4C, a cross-sectional structure of a memory cell array along C-D in FIG. 4A is shown. The cross-sectional structure shown in FIG. 4C is the same as the one shown in FIG. 1C.

Next, a manufacturing method of a semiconductor device described in the present embodiment mode will be explained using FIGS. 5A to 5E.

Figure 5A:
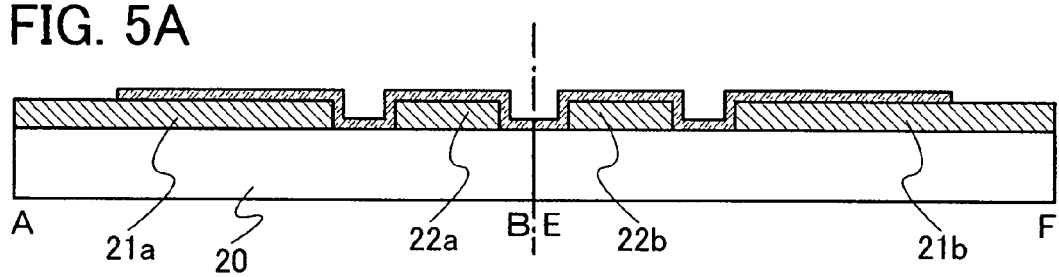
FIGS. 5A to 5E are cross-sectional diagrams used to explain a manufacturing process of a semiconductor device of the present invention.
Figure 5B:
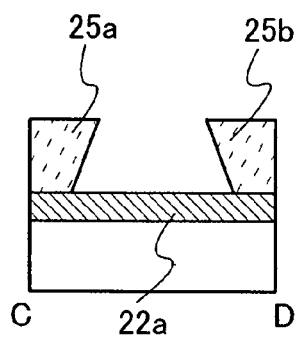

FIGS. 5A and 5C to 5E illustrate manufacturing steps of A-B and E-F in FIG. 4B, and FIG. 5B illustrates a manufacturing step of C-D in FIG. 4C.

As shown in FIG. 5A, as in the Embodiment Mode 1, first conductive layers 22a and 22b and wirings 21a and 21b are formed over a substrate 20.

Next, as shown in FIG. 5B, insulating layers 25a and 25b that function as partition walls are formed over the first conductive layer 22a.

Figure 5C:
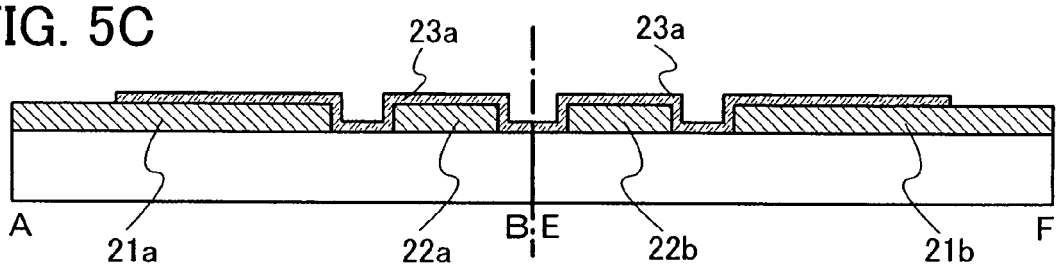

Next, as shown in FIG. 5C, an organic compound layer 23a is formed over the substrate 20, the wirings 21a and 21b, and the first conductive layers 22a and 22b. It is to be noted that, although not shown in FIG. 5C, in the present embodiment mode, as well, because side surfaces of the insulating layers 25a and 25b that function as partition walls are reverse-trapezoidal shaped, when the organic compound layers are formed, the organic compound layers are formed over the insulating layers 25a and 25b that function as partition walls as well as between the insulating layers 25a and 25b that function as partition walls. That is, the organic compound layer 23a formed over the substrate 20 and the first conductive layer 22a is separated from organic compound layers formed over the insulating layers 25a and 25b and also formed in a direction of intersection with the first conductive layer 22a.

Figure 5D:
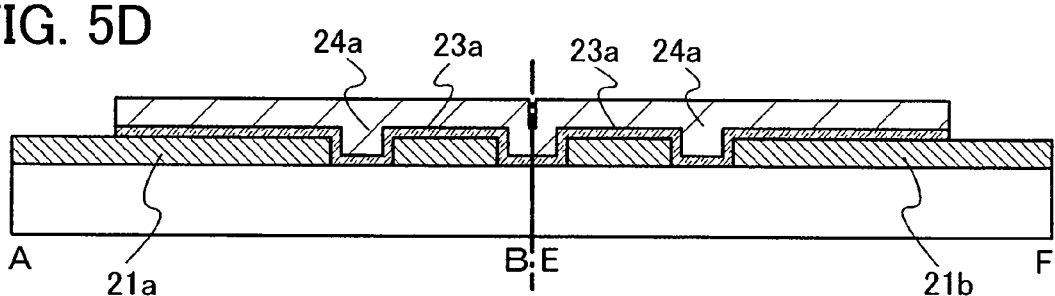
Figure 5E:
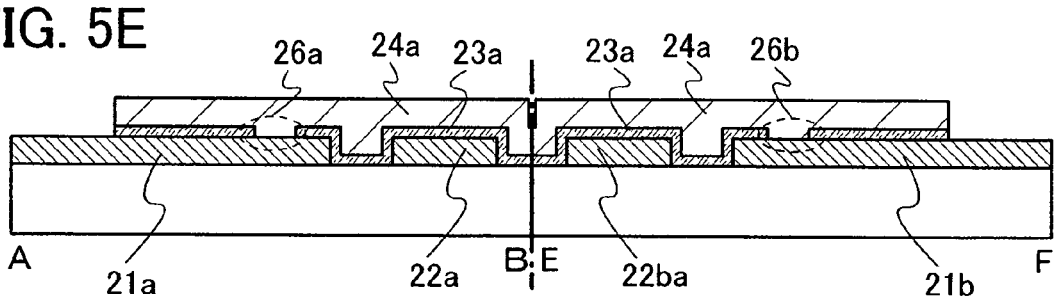

Next, as shown in FIG. 5D, a second conductive layer 24a is formed over the organic compound layer 23a.

Next, a given voltage is applied to the first wiring 21a and the second wiring 21b; the crystal conditions, conductivity, and shape of the organic compound layer 23a are made to change so that the first wiring 21a, the second conductive layer 24a, and the second wiring 21b are short-circuited. As a result of this, the first wiring 21a and the second conductive layer 24a are connected through the opening 26a in the organic compound layer 23a, and the second wiring 21b and the second conductive layer 24a are connected through the opening 26b in the organic compound layer 23a.

By performance of the above steps, a second conductive layer connected to a wiring, which is formed at the same time as a first conductive layer is formed, can be formed in an opening of an organic compound layer. In addition, a semiconductor device that is more miniaturized than a conventional semiconductor device can be manufactured. Furthermore, for a semiconductor device that has the same area as a conventional semiconductor device, a semiconductor device in which the amount of stored information is increased can be manufactured.

Embodiment Mode 3

In the above embodiment modes, a manufacturing method of a semiconductor device in which the shape of an insulating layer that functions as a partition wall differs from the shapes of those of the above embodiment modes will be explained using FIGS. 6A to 6C and FIGS. 7A to 7H.

Figure 6A:
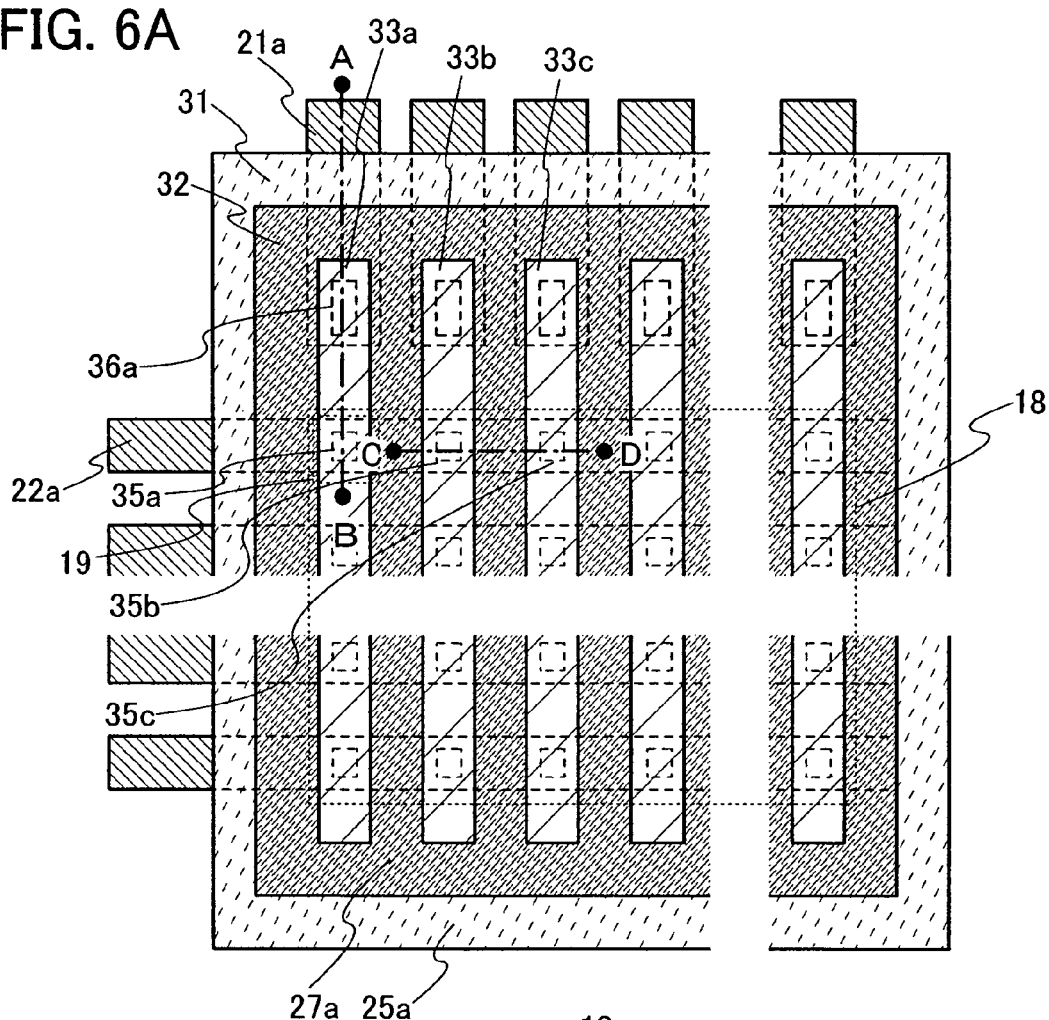
FIGS. 6A to 6C are top-view and cross-sectional diagrams used to explain a semiconductor device of the present invention.

In the present embodiment mode, a memory cell array in which memory cells, each including a first conductive layer, an organic compound layer, and a second conductive layer, are arranged in matrix will be explained using FIGS. 6A to 6C. FIG. 6A shows a top view of a memory cell array, FIG. 6B shows a cross-sectional view of a cross section taken along A-B in FIG. 6A, and FIG. 6C shows a cross-sectional view of a cross section taken along C-D in FIG. 6A.

In a memory array 18, a memory cell 19 is provided in a matrix (refer to FIG. 6A). The memory cell 19 has a memory element 10 (refer to FIG. 6B). The memory cell 10 has a first conductive layer 22a extending in a first direction, an organic compound layer 32 that covers the first conductive layer 22a, and a second conductive layer 33a extending in a second direction that intersects with the first direction formed over a substrate 20. In addition, wirings, formed at the same time as the first conductive layer is formed, are formed on the outer side of a plurality of the first conductive layers. That is, the first conductive layer and the first wiring come into contact with the same substrate 20.

Figure 6B:
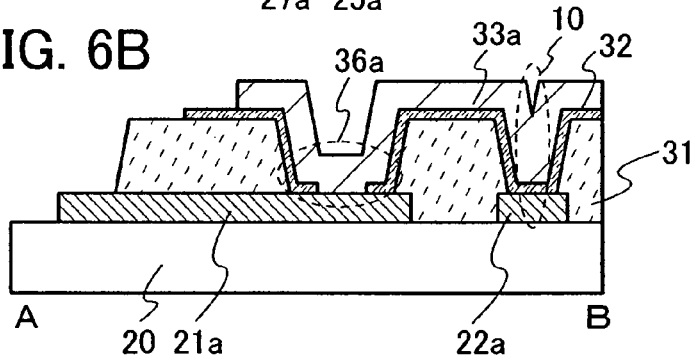
Figure 6C:
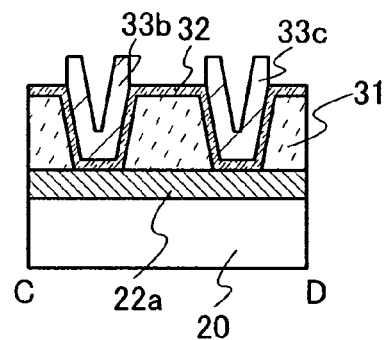

In FIG. 6B, a cross-sectional structure of a wiring and a memory cell array is shown.

A wiring 21a and a first conductive layer 22a are formed over a substrate 20. An insulating layer 31 that functions as a partition wall is formed over the substrate 20, the wiring 21a, and the first conductive layer 22a. In addition, in an opening 35a of the insulating layer 31, over the first conductive layer 22a and the wiring 21a, an organic compound layer 32 is formed. Furthermore, over the organic compound layer 32, a second conductive layer 33a is formed. The second conductive layer 33a is connected to the wiring 21a in an opening 36a of the organic compound layer 32.

In FIG. 6C, a cross-sectional structure of a memory cell array is shown. It is to be noted that FIG. 6C shows a cross-sectional structure in which the direction along which the cross section in FIG. 6C is taken is perpendicular to the direction along which the cross section in FIG. 6B is taken.

A first conductive layer 22a is formed over a substrate 20. Over the first conductive layer 22a, an insulating layer 31 that functions as a partition wall is formed. In addition, an organic compound layer 32 is formed in openings 35b and 35c of the insulating layer 31 that functions as a partition wall and over an exposed portion of the first conductive layer 22a. Furthermore, over the organic compound layer 32, second conductive layers 33b and 33c are formed.

Moreover, a semiconductor element is made up of the first conductive layer 22a, the organic compound layer 32, and the second conductive layer 33a. In addition, a semiconductor element is made up of the first conductive layer 22a, the organic compound layer 32, and the second conductive layer 33b. Furthermore, a semiconductor element is made up of the first conductive layer 22a, the organic compound layer 32, and the second conductive layer 33c.

For the second conductive layers 33a, 33b, and 33c, the same materials used for the second conductive layers 24a and 24b of the above embodiment modes can be used.

For the materials and a manufacturing method of the organic compound layer 32, the materials and manufacturing method used for the organic compound layers 23a and 23b and 27a and 27b of the above embodiment modes can be used. However, for the shape of the cross section of the insulating layer 31 that functions as a partition wall, because the shape is one in which the length of the lower base is longer than the length of the upper base, that is, trapezoidal, an organic compound layer formed over the insulating layer 31 and the first conductive layer 22a is not separated into different regions but all connected together.

For the insulating layer 31 that functions as a partition wall, the same materials used for the insulating layers 25a and 25b that function as partition walls of the above embodiment modes can be used accordingly.

As described in the present embodiment mode, by a wiring, formed at the same time as a first conductive layer is formed, and a second conductive layer being connected in an opening formed in an organic compound layer, the amount of margin for alignment of a mask can be reduced. For this reason, a semiconductor device that is more miniaturized than a conventional semiconductor device can be manufactured. Furthermore, for a semiconductor device that has the same area as a conventional semiconductor device, because the amount of integration of a memory cell can be increased, a high level of integration can be obtained.

Next, a manufacturing method of the semiconductor device described in the present embodiment mode will be explained using FIGS. 7A to 7H.

FIGS. 7A, 7C, 7E, and 7G show a manufacturing process of A-B in FIG. 6B, and FIGS. 7B, 7D, 7F, and 7H show a manufacturing process of C-D in FIG. 6C.

As shown in FIGS. 7A and 7B, a first conductive layer 22a and a wiring 21a are formed over a substrate 20, and an insulating layer 31 that functions as a partition wall is formed over the first conductive layer 22a and the wiring 21a. The insulating layer 31 that functions as a partition wall can be formed using a photosensitive material or a non-photosensitive material. When a photosensitive material is used, the insulating layer 31 that functions as a partition wall can be formed using a photomask and selective exposing and developing of the photosensitive material. Alternatively, the insulating layer 31 that functions as a partition wall can be formed by developing of a photosensitive material after the photosensitive material is irradiated with a laser beam by selective irradiation and exposed.

Next, as shown in FIGS. 7C and 7D, an organic compound layer 32 is formed over the wiring 21a, the first conductive layer 22a, and the insulating layer 31. It is to be noted that, in the present embodiment mode, because the cross section of the insulating layer 31 that functions as a partition wall is trapezoidal, an organic compound layer formed over substrate is not separated into different parts, and the organic compound layer 32 is formed continuously over the insulating layer 31, the first conductive layer 22a, and the wiring 21a.

Next, the organic compound layer 32 is irradiated with a laser beam 29, laser ablation is performed on part of the organic compound layer 32, and an opening 26a is formed, as shown in FIG. 7E. It is to be noted that, when the organic compound layer 32 is formed, by use of a mask that can be used to form the opening 36a, even if the step of irradiation with the laser beam 29 shown in FIG. 7C is not performed, the opening 36a can still be formed.

Next, as shown in FIGS. 7G and 7H, second conductive layers 33a, 33b, and 33c are formed over the organic compound layer 32.

For the second conductive layers 33a, 33b, and 33c, the same manufacturing method used for the second conductive layers 24a and 24b of the above embodiment modes can be used accordingly. It is to be noted that, when a sputtering method or a CVD method is used, after a conductive layer has been formed over the organic compound layer 32, the conductive layer is selectively etched using a mask, and the second conductive layers 33a, 33b, and 33c are each formed as a striped shape in a second direction as shown in FIG. 6A.

It is to be noted that, in the present embodiment mode, the method used in Embodiment Mode 1 for connecting the second conductive layers 24a and 24b and the wiring 21a, is used; however, the method used in Embodiment Mode 2 can be used, accordingly.

By performance of the above steps, in the opening of an organic compound layer, a second conductive layer connecting to a wiring, which is formed at the same time as a first conductive layer is formed, can be formed. In addition, a semiconductor device that is more miniaturized than a conventional semiconductor device can be manufactured. Furthermore, for a semiconductor device that has the same area as a conventional semiconductor device, a semiconductor device in which the amount of stored information is increased can be manufactured.

Embodiment Mode 4

Data reading operations and data writing operations of a semiconductor device described in the above embodiment modes will be explained using FIGS. 8A to 8C.

Figure 8A:
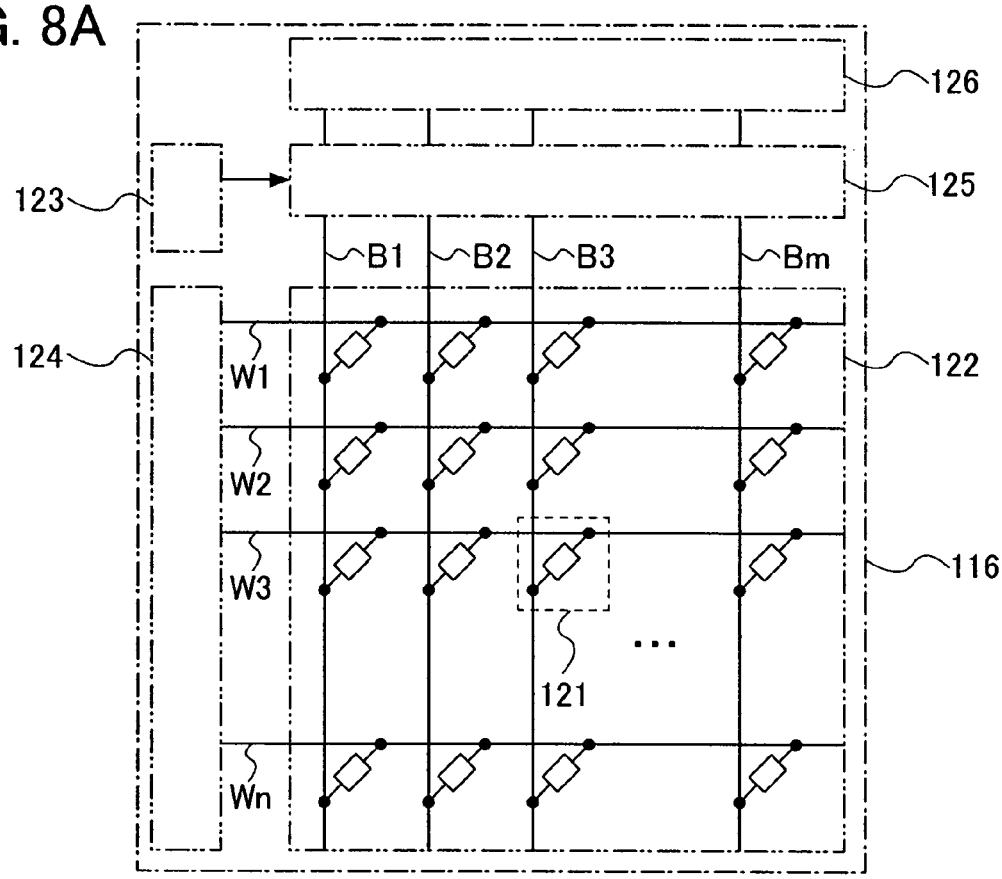
FIGS. 8A to 8C are diagrams used to explain a semiconductor device of the present invention.
Figure 8B:
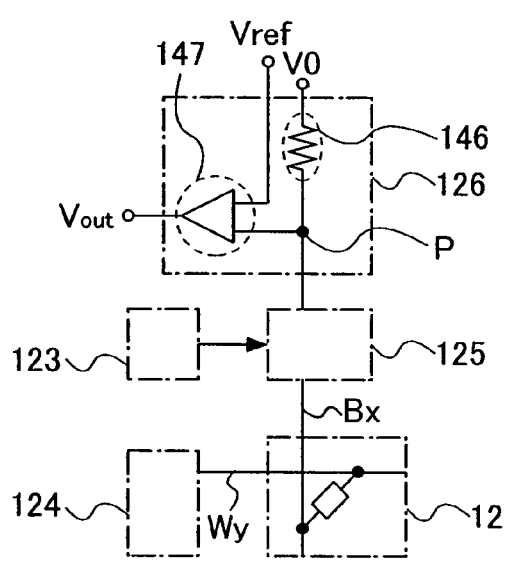
Figure 8C:
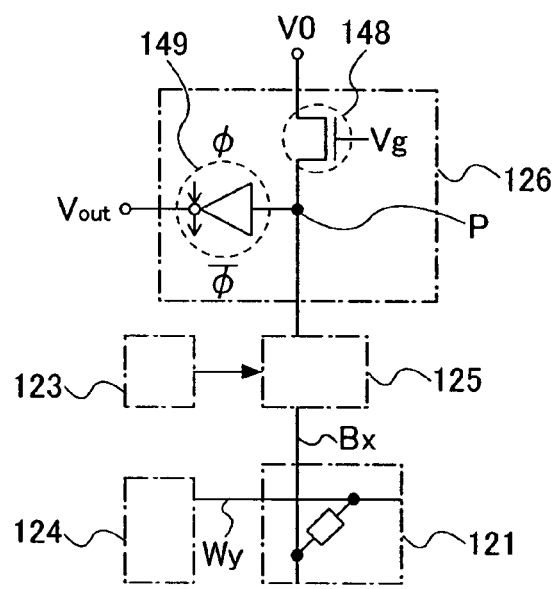

As shown in FIG. 8A, a semiconductor device 122 of the present embodiment mode has a memory cell array 116 and driving circuits such as decoders 123 and 124, a selector 125, a reading/writing circuit 126, and the like. The memory cell array 116 is formed of a plurality of memory cells 121. In the memory cell 121, a first conductive layer, an organic compound layer, and a second conductive layer are stacked, in order. The first conductive layer is connected to a word line Wy ($1 \leq y \leq n$) or uses the word line Wy. In addition, the second conductive layer uses a bit line Bx ($1 \leq s \leq m$).

Operations performed while writing of data to a memory cell is being performed will be explained. A case where writing of data is performed by an electrical operation will be explained. It is to be noted that writing is performed using a change in the electrical characteristics of the memory cell, and the initial state (a state in which electrical operations have not been performed) of the memory cell is set to be data of "0" and the state in which electrical characteristics have been changed is set to be data of "1."

When data of "1" is written to the memory cell 121, first, the memory cell 121 is selected by the decoders 123 and 124 and the selector 125. Specifically, a given voltage V2 is applied to a word line W3 connected to the memory cell 121 by the decoder 124. In addition, a bit line B3 connected to the memory cell 121 is connected to a reading/writing circuit 126 by the decoder 123 and the selector 125. A writing voltage V1 is output to the bit line B3 from the reading/writing circuit 126. In this way, a voltage Vw=V1-V2 is applied between the first conductive layer and the second conductive layer making up the memory cell 121. By appropriate selection of the potential Vw, physical characteristics or electrical characteristics of an organic compound layer provided between the conductive layers can be changed, and writing of data of "1" is performed. Specifically, in the voltage for the reading operation, electrical resistance between the first conductive layer and the second conductive layer during a state in which data is "1," compared to a state in which data is "0," can be greatly decreased, and the voltage Vw can be set to be from 5 V to 15 V or from −5 V to −15 V. For example, the voltage Vw can be set where (V1, V2)=(0 V, from 5V to 15 V), (V1, V2)=(from 3 V to 5 V, from −12 V to −2 V), or the like.

It is to be noted that in a non-selected word line and in a non-selected bit line, a connected memory cell is controlled so that data of "1" is not written to the memory cell. For example, a non-selected word line and a non-selected bit line may each be placed in a floating state. Between a first conductive layer and a second conductive layer making up a memory cell, a characteristic, such as diode characteristics or the like, by which selectivity can be maintained is needed.

In contrast, when data of "0" is written to the memory cell 121, electrical operations need not be performed on the memory cell 121. For the circuit operations, for example, as in when data of "1" is written, the memory cell 121 is selected by the decoders 123 and 124 and the selector 125; however, an output potential output from the reading/writing circuit 126 to the bit line B3 is set to be about the same as the potential of the selected word line W3 or the potential of a non-selected word line, and a voltage of a level that does not cause changes in the electrical characteristics of the memory cell 121 (for example, a voltage of from −5 V to 5 V) may be applied between the first conductive layer and the second conductive layer making up the memory cell 121.

Next, operations performed when reading of data from the memory cell is performed will be explained (refer to FIGS. 8B and 8C). Reading of data is performed using the fact that electrical characteristics between the first conductive layer and the second conductive layer making up the memory cell 121 are different for a memory cell that has data of "0" compared to those for a memory cell that has data of "1." For example, a reading method using a difference in electrical resistance will be explained, where the effective electrical resistance (hereinafter referred to as simply the electrical resistance of a memory cell) between the first conductive layer and the second conductive layer making up a memory cell that has data of "0" is set as R0 at a reading voltage, and the electrical resistance of a memory cell that has data of "1" is set as R1 at a reading voltage. It is to be noted that R1 and R0 are set so that R1<<R0. A reading/writing circuit, for a structure of the reading part, for example, a circuit 126, shown in FIG. 8B, that uses a resistive element 146 and a differential amplifier 147 can be considered. The resistive element 146 has a resistance of Rr, where Rr is set so that R1<Rr<R0. A transistor 148 may be used in place of the resistive element 146, and a clocked inverter 149 may be used in place of the differential amplifier 147 (FIG. 8C). The clocked inverter 149 is set to High when reading is being performed and set to Low when reading is not being performed, and a signal $\phi$ or a reverse signal $\bar{\phi}$ is input. Of course, the circuit structure is not limited to the structures shown in FIGS. 8B and 8C.

When reading of data from the memory cell 121 is performed, first, the memory cell 121 is selected by the decoders 123 and 124 and the selector 125. Specifically, by the decoder 124, a given voltage Vy is applied to a word line Wy connected to the memory cell 121. In addition, by the decoder 123 and the selector 125, a bit line Bx connected to the memory cell 121 is connected to a terminal P of the reading/writing circuit 126. As a result, a potential Vp of the terminal P, by resistance division with the resistive element 146 (resistance, Rr) and the memory cell 121 (resistance, R0 or R1), becomes a determined value. Consequently, when the memory cell 121 has data of "0," the value for Vp0 becomes Vp0=Vy+(V0−Vy)×R0/(R0+Rr). Additionally, when the memory cell 121 has data of "1," the value for Vp1 becomes Vp1=Vy+(V0−Vy)×R1/(R1+Rr). As a result, as in FIG. 8B, by selection so that Vref is between Vp0 and Vp1, and, as in FIG. 8C, by selection so that the transition point of a clocked inverter is between Vp0 and Vp1, for an output potential Vout, in response to data of "0"/"1," Low/High (or High/Low) is output, and reading can be performed.

For example, the differential amplifier is set to operate at Vdd=3 V, and Vy, V0, and Vref are set so that Vy=0 V; V0=3 V, and Vref=1.5 V. Supposing that R0/Rr=Rr/R1=9, when data of the memory cell is "0," Vp0 becomes Vp0=2.7 V, Vout is output as High; when data of the memory cell is "1," Vp1 becomes Vp1=0.3 V, Vout is output as Low. In this way, reading of the memory cell can be performed.

By performance of the above steps, the state of the electrical resistance of an organic compound layer can be read by reading the voltages using differences in resistance and resistance division. Of course, the reading method is not limited to this method. For example, in addition to the use of differences in electrical resistances, reading may be performed using differences in electrical currents. Alternatively, when the electrical characteristics of the memory cell include diode characteristics in which threshold voltage varies for data of "0" and for data of "1," reading may be performed using the difference in threshold voltages.

Embodiment Mode 5

Figure 9A:
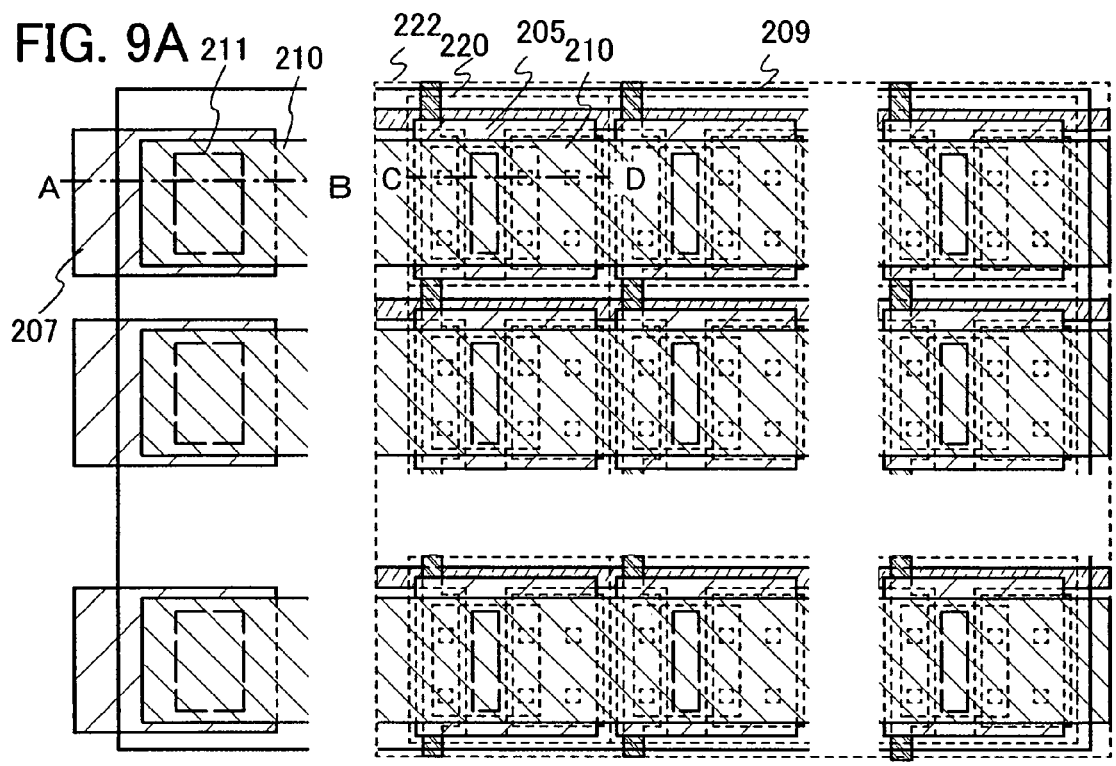
FIGS. 9A to 9C are top-view and cross-sectional diagrams used to explain a semiconductor device of the present invention.

In the present embodiment mode, a main part of a semiconductor device will be explained. As a typical example, a main part of a semiconductor device that includes a memory cell array including a memory cell in which a switching element and a memory element are included will be explained using FIGS. 9A to 9C. It is to be noted that the memory element includes a first conductive layer, an organic compound layer, and a second conductive layer. FIG. 9A shows a top view of a memory cell array, FIGS. 9B and 9C show cross-sectional views of cross sections taken along A-B and C-D in FIG. 9A.

In a memory cell array 222, a plurality of memory cells 220 is arranged in matrix. In addition, each memory cell 220 has a transistor 202 functioning as a switching element formed over a substrate 200 that has an insulating surface and a memory element 212, connected to the transistor 202 (refer to FIGS. 9A and 9B). The memory element 212 has a first conductive layer 206 formed over an insulating layer 205, an organic compound layer 209, and a second conductive layer 210. It is to be noted that the organic compound layer 209 is formed over the first conductive layer 206 and over an insulating layer 208 that functions as a partition wall formed over part of the conductive layer 206. Furthermore, for the transistor 202, a thin film transistor is used. In addition, an insulating layer, functioning as a protective layer, covering the second conductive layer 210 may be formed.

In FIG. 9A, the second conductive layer 210 of the memory element 212 is formed into a striped shape that extends in a direction parallel to a gate wiring of a thin film transistor. In addition, a wiring 207 is formed in a direction in which the second conductive layer 210 extends. It is to be noted that the second conductive layer 210 of the memory element 212 may be formed into a striped shape that extends in a direction parallel to a source wiring of a thin film transistor. In this case, the wiring 207 is formed in the direction in which the second conductive layer 210 extends.

Figure 9B:
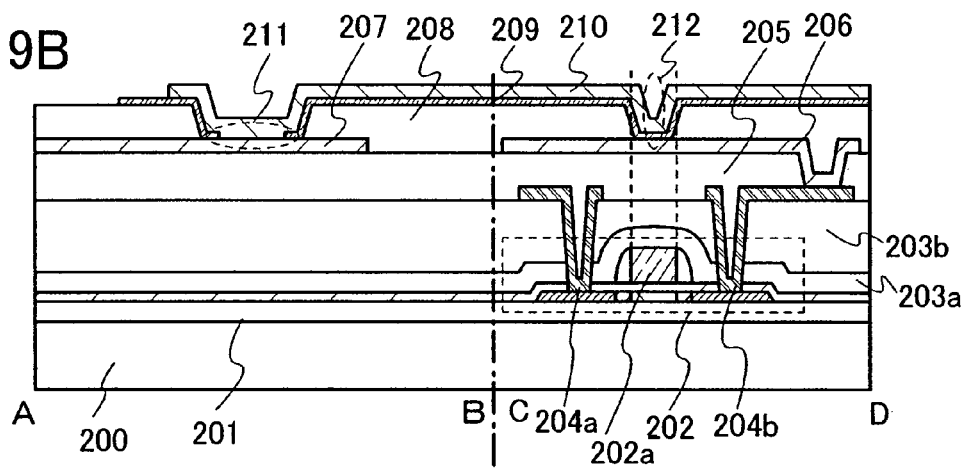
Figure 9C:
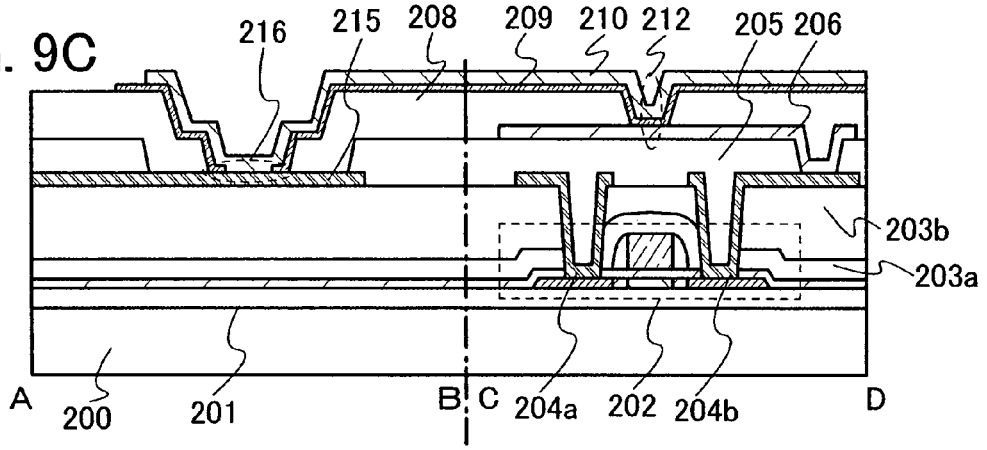

In addition, in FIG. 9B, over an insulating layer 205, a wiring 207, formed at the same time as the first conductive layer 206 is formed, is formed, and an insulating layer 208 with an opening, an organic compound layer 209, and a second conductive layer 210 are formed over the wiring 207. Furthermore, the wiring 207 and the second conductive layer 210 are connected through an opening 211 in the organic compound layer 209.

In addition, the wiring can be formed at the same time as a gate electrode of the transistor is formed. Moreover, a wiring can be formed at the same time as a wiring of a transistor is formed. In FIG. 9C, a mode is shown in which a wiring 215 formed at the same time as transistor wirings 204a and 204b is connected to the second conductive layer 210 through an opening 216 in an organic compound layer 209.

For the connection methods of connecting the second conductive layer 210 of the memory element 212 and the wirings 207 and 215, the connection methods of the above embodiment modes may be applied accordingly.

Figure 16A:
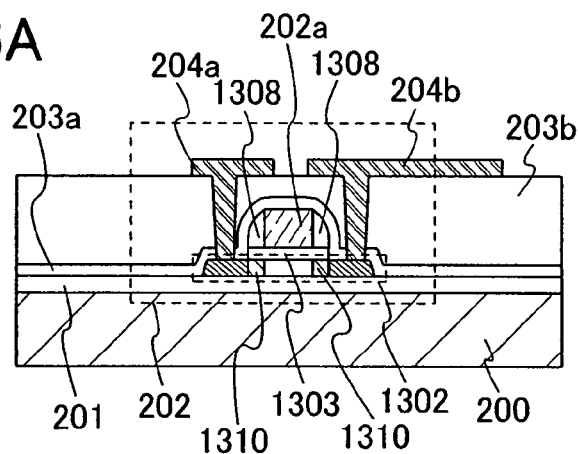
FIGS. 16A to 16D are diagrams that each illustrate a structure of a transistor which can be applied to the present invention.

One mode of a thin film transistor that can be used for the transistor 202 will be described using FIGS. 16A to 16D. FIG. 16A shows an example in which a top-gate thin film transistor is applied. An insulating layer 201 is provided over a substrate 200 that has an insulating surface, and a thin film transistor is provided over the insulating layer 201. In the thin film transistor, a semiconductor layer 1302 and an insulating layer 1303 that can function as a gate insulating layer are provided over the insulating layer 201. Over the insulating layer 1303, a gate electrode 202a corresponding to the semiconductor layer 1302 is formed, and an insulating layer 203a functioning as a protective layer and an insulating layer 203b functioning as an interlayer insulating layer are provided thereover. In addition, wirings 204a and 204b, each connected to a source region or drain region of the semiconductor layer, are formed.

The semiconductor layer 1302 is formed of a semiconductor that has a crystalline structure, and either a non-single crystal semiconductor or a single crystal semiconductor can be used. In particular, using a crystalline semiconductor formed by crystallization of an amorphous or microcrystal semiconductor by laser irradiation, heat treatment, or a combination of laser irradiation and heat treatment is preferable. For heat treatment, a crystallization method using a metallic element from the periodic table of elements, such as nickel or the like, that promotes crystallization of a silicon semiconductor can be applied.

When crystallization is performed by irradiation with a laser beam, by irradiation with a continuous wave laser beam or an ultrashort pulsed laser beam with a high repetition rate of 10 MHz or more and a pulse width of 1 nanosecond or less, preferably, from 1 to 100 picoseconds, crystallization can be performed by continuous movement of a melting zone of a melted crystallized semiconductor in the direction of irradiation with the laser beam. By performance of this kind of crystallization method, a crystalline semiconductor in which grain diameter is large and crystal grain boundaries extend in one direction can be obtained. If the direction of carrier drift is set to be the same as the direction in which the crystal grain boundaries extend, electron field effect mobility can be increased. For example, an electron field effect mobility of 400 cm/(V.s) or more can be obtained.

When the above crystallization step is performed using a crystallization process in which a glass substrate is heated to a temperature less than or equal to the allowable temperature limit of the glass substrate (approximately 600° C.), a glass substrate with a large area can be used. For this reason, a large number of semiconductor devices can be manufactured per substrate, and costs can be lowered.

In addition, the semiconductor layer 1302 may be formed by performance of a crystallization step in which a glass substrate is heated to a temperature above the allowable temperature limit for the glass substrate. Typically, a quartz substrate is used for the substrate 200 that has insulative properties, and a semiconductor layer 1302 is formed by heating of an amorphous or microcrystalline semiconductor at a temperature of 700° C. or more. As a result, a semiconductor with a high level of crystallinity can be formed. Because of this, a thin film transistor in which properties such as response speed and mobility are favorable and in which operations can be performed at high speed can be provided.

The insulating layer 1303 that can function as a gate insulating layer can be formed, as appropriate, using a silicon oxide layer, a silicon nitride layer, a silicon oxynitride layer, or the like, by a thin film formation method such as a CVD method, a PVD method, or the like.

The gate electrode 202a can be formed using a metal or a polycrystalline semiconductor to which an impurity of one conductivity type has been added. When a metal is used, tungsten (W), molybdenum (Mo), titanium (Ti), tantalum (Ta), aluminum (Al), or the like can be used. In addition, a metal nitride in which one of the above metals has been nitrided can be used, as well. Alternatively, a stacked structure of a first layer made from one of the above metal nitrides and a second layer made from one of the above metals can also be used. When a stacked structure is used, the structure may be one in which the edge of the first layer extends beyond the edge of the second layer. At this time, with a metal nitride used for the first layer, the metal nitride can be set as a barrier metal. That is, diffusion of metal from the second layer into the insulating layer 1303 and into the layer below, which is the semiconductor layer 1302, can be prevented.

On side surfaces of the gate electrode 202a, sidewalls (sidewall spacers) 1308 are formed. For the sidewall, an insulating layer formed of silicon oxide over a substrate by a CVD method is formed, and the insulating layer can be formed by anisotropic etching using an RIE (Reactive Ion Etching) method.

For the structure of the transistor made up of a combination of the semiconductor layer 1302, the insulating layer 1303, the gate electrode 202a, and the like, various kinds of structure, such as a single-drain structure, an LDD (lightly doped drain) structure, a gate-overlapped drain structure, and the like can be applied. Here, a thin film transistor with an LDD structure, in which low concentration impurity regions 1310 are formed in a semiconductor layer that overlaps with the sidewalls, is shown. In addition, a single-gate structure; a multi-gate structure made up of a form in which transistors, where a gate voltage of the same potential is applied equally to all, are connected in series; or a dual gate structure in which a semiconductor layer is placed sandwiched by gate electrodes on top and bottom can also be applied.

For the insulating layer 203a, forming the insulating layer 203a using a thin film formation method such as a plasma CVD method, a sputtering method, or the like and using silicon nitride, silicon oxide, silicon nitride oxide, silicon oxynitride, aluminum oxynitride, aluminum oxide, or some other insulating material is preferable.

The insulating layer 203b is formed of an inorganic insulating material such as silicon oxide, silicon oxynitride, or the like or formed of an organic insulating material such as an acrylic resin, a polyimide resin, or the like. When a coating method such as a spin coating method, a roll coating method, or the like is used, an insulating layer formed using silicon oxide, which is formed by heat treatment after application of an insulating layer material dissolved in an organic solvent, can be used. For example, a coated layer containing a siloxane bond is formed, and an insulating layer that can be formed by heat treatment at a temperature in the range of 200° C. to 400° C. can be used. If the insulating layer 203b is formed using an insulating layer formed by a coating method or using an insulating layer that has been planarized by reflow, disconnection of a wiring formed over that layer can be prevented. In addition, when a multilayer interconnection structure is formed, the insulating layer can be used effectively.

Wirings 204a and 204b are formed over the insulating layer 203b, the wirings 204a and 204b can be provided so as to intersect with wirings formed of the same kind of layer as the gate electrode 202a, and a multilayer interconnection structure is formed. A plurality of insulating layers having the same function as the insulating layer 203a are stacked, and a multilayer interconnect structure can be formed by formation of a wiring over those layers. It is preferable that the wirings 204a and 204b each be formed of a combination of a material with low resistance, such as aluminum (Al) or the like, and a barrier metal using a metallic material with a high melting point, such as titanium (Ti), molybdenum (Mo), or the like, for example, as a multilayer structure of titanium (Ti) and aluminum (Al), a multilayer structure of molybdenum (Mo) and aluminum (Al), or the like.

Figure 16B:
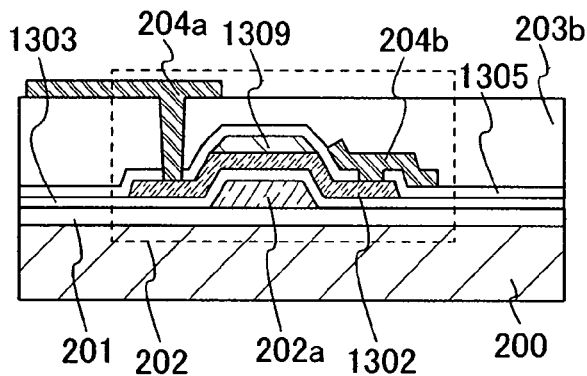

In FIG. 16B, an example is shown in which a bottom gate thin film transistor is applied. An insulating layer 201 is formed over a substrate 200 that has an insulating surface, and a thin film transistor is provided thereover. In the thin film transistor, a gate electrode 202a, an insulating layer 1303 functioning as a gate insulating layer, a semiconductor layer 1302, a channel protective layer 1309, an insulating layer 1305 functioning as a protective layer, and an insulating layer 203b functioning as an interlayer insulating layer are provided. Furthermore, over that top layer, an insulating layer functioning as a protective layer may be formed. Wirings 204a and 204b can be formed over the insulating layer 1305 or over the insulating layer 203b. It is to be noted that, in the case of a bottom gate thin film transistor, the insulating layers 1305 and 203b need not be formed.

In addition, when the substrate 200 that has an insulating surface is a flexible substrate, the allowable temperature limit is low compared to that of a non-flexible substrate such as a glass substrate or the like. For this reason, an organic semiconductor can be used as the semiconductor layer of the transistor.

Moreover, if the thin film transistor or organic transistor can function as a switching element, the transistor may be provided with any kind of structure.

Figure 16C:
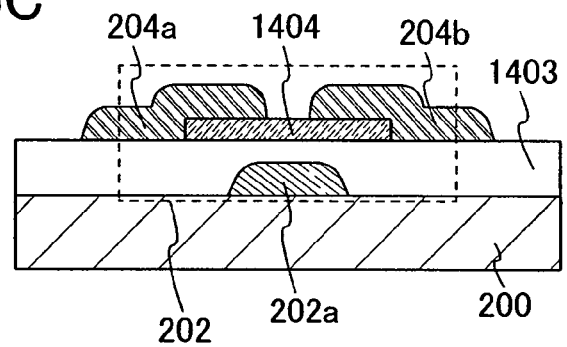

Here, a structure of a thin film transistor using an organic semiconductor for the transistor 202 will be explained with reference to FIGS. 16C and 16D. In FIG. 16C, an example is shown in which a staggered organic semiconductor transistor is applied. Over a substrate 200, an organic semiconductor transistor is provided as a transistor 202. In the organic semiconductor transistor, a gate electrode 202a, an insulating layer 1403 functioning as a gate insulating layer, a semiconductor layer 1404 overlapping with the gate electrode 202a and the insulating layer 1403 functioning as a gate insulating layer, and first wirings 204a and 204b connected to the semiconductor layer 1404 are formed. It is to be noted that part of the semiconductor layer 1404 is interposed between the insulating layer 1403 functioning as a gate insulating layer and the first wirings 204a and 204b.

The gate electrode 202a can be formed using a droplet discharge method and then drying and baking. In addition, the gate electrode 202a can be formed by printing of a paste containing particles over a substrate that has flexibility by a printing method, drying, and baking. As typical examples of the particles, particles with any of the following as the main component or components may be used: gold, copper, a gold and silver alloy, a gold and copper alloy, a silver and copper alloy, or a gold, silver, and copper alloy. Furthermore, particles containing a conductive oxide such as indium tin oxide (ITO) or the like may be used.

The insulating layer 1403 functioning as a gate insulating layer can be formed using the same materials and methods with which the insulating layer 1303 is formed. However, when an insulating layer is formed by heat treatment after application of an insulating material dissolved in an organic solvent, heat treatment is performed at a heat treatment temperature lower than the allowable temperature limit of a substrate that has flexibility.

For materials of the semiconductor layer 1404 of the organic semiconductor transistor, a polynuclear aromatic compound, a conjugated double bond derivative compound, phthalocyanine, a charge transfer complex, and the like can be given. For example, anthracene, tetracene, pentacene, 6T (hexathiophen), TCNQ (tetracyanoquinodimethan), PTCDA (perylenecarboxylic acid anhydride), NTCDA (naphthalene carboxylic acid anhydride), or the like can be used. In addition, for the materials of the semiconductor layer 1404 of the organic semiconductor transistor, a π-conjugated system macromolecule such as an organic polymer compound, a carbon nanotube, polyvinyl pyridine, a phthalocyanine metallic complex, and the like can be given. In particular, using polyacetylene, polyaniline, polypyrrole, polythienylene, a polythiophene derivative, poly (3-alkylthiophene), a polyparaphenylene derivative, a polyparaphenylene vinylene derivative, or the like, which are π-conjugated system macromolecules of which the skeleton is composed of conjugated double bonds, is preferable.

Furthermore, for a formation method of the semiconductor layer 1404 of the organic semiconductor transistor, a method in which a layer with a uniform film thickness is formed over a substrate can be used. It is desirable that the thickness be greater than or equal to 1 nm and less than or equal to 1000 nm, preferably, greater than or equal to 10 nm and less than or equal to 100 nm. For a specific method, a vapor deposition method, a coating method, a spin coating method, a bar coating method, a solution casting method, a dipping method, a screen printing method, a roll coater method, a droplet discharge method, or the like can be used.

Figure 16D:
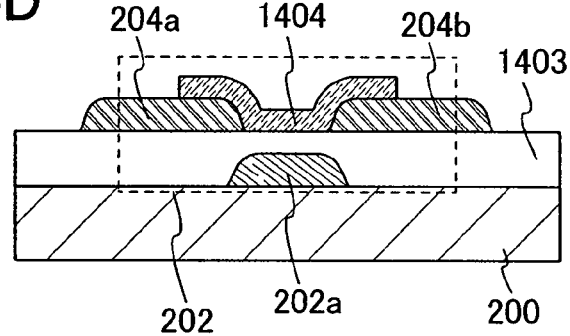

In FIG. 16D, an example is shown in which a coplanar organic semiconductor transistor is applied. Over a substrate 200, an organic semiconductor transistor is provided as a transistor 202. In the organic semiconductor transistor, a gate electrode 202a, an insulating layer 1403 functioning as a gate insulating layer, first wirings 204a and 204b, and a semiconductor layer 1404 overlapping the gate electrode 202a and the insulating layer 1403 functioning as a gate insulating layer are formed. In addition, part of the first wirings 204a and 204b are interposed between the insulating layer 1403 functioning as a gate insulating layer and the semiconductor layer 1404.

In addition, using a single-crystal substrate or an SOI substrate, a transistor may be formed, and a memory element may be formed thereover. The SOI substrate may be formed using a method in which wafers are bonded together or a method referred to as SIMOX in which an insulating layer is formed inside a Si substrate by implantation of oxygen ions into the Si substrate.

Because characteristics such as response speed, mobility, and the like in a transistor formed using this kind of single-crystal semiconductor are excellent, a transistor in which operation at a high speed is possible can be provided. Furthermore, for the transistor, because there are few variations in those characteristics, a semiconductor device with a high level of reliability can be obtained.

A memory element 212 includes a first conductive layer 206 formed over an insulating layer 205, a partition wall (insulating layer) 208 covering part of the first conductive layer 206, the first conductive layer 206, an organic compound layer 209 covering the partition wall (insulating layer) 208, and a second conductive layer 210.

As thus described, by provision of the insulating layer 205 and formation of the memory element 212, the first conductive layer 206 can be placed freely. That is, forming the memory element 212 over the transistor 202 becomes possible. Consequently, a higher level of integration in a semiconductor device becomes possible. Furthermore, by formation of the memory element 212 directly over the gate electrode 202a, where the wirings 204a and 204b and an edge of the gate electrode 202a are not covered, unevenness in a base region (that is, in the surface of the insulating layer 205) where the first conductive layer 206 is formed can be reduced. For this reason, unevenness in the surface of the first conductive layer can be reduced, writing of data not intended to be written to the memory element 212 can be suppressed, and reliability can be increased.

Formation of the first conductive layer 206, the organic layer 209, and the second conductive layer 210 can be performed using any of the same materials and formation methods that are described in the above embodiment modes with which formation of the first conductive layer 22a, the organic layer 23a, and the second conductive layers 24a and 24b is performed.

In addition, the insulating layer 208 can be formed by application, accordingly, of the same materials and formation methods that are described in the above embodiment modes with which the insulating layers 25a, 25b and 31 are formed.

An element that has a rectifying property may be formed between the insulating layer 205 and the first conductive layer 206. In addition, between the first conductive layer 206 and the organic compound layer 209, an element that has a rectifying property may be formed. Furthermore, between the organic compound layer 209 and the second conductive layer, an element that has a rectifying property may be formed. Moreover, over the second conductive layer 210, an element that has a rectifying property described in Embodiment Mode 1 may be provided.

In addition, a separation layer is provided between the substrate 200 that has an insulating surface and the insulating layer 201; after an element formation layer that includes a switching element and the memory element 212 is formed over the separation layer, the element formation layer may be separated from the separation layer and bonded to a substrate that has flexibility. It is to be noted that, for a separation method, any of the following may be used: (1) a method in which a metal oxide layer used as a separation layer is provided between a substrate that has an insulating surface and an element formation layer, the metal oxide layer is made brittle by crystallization, and the element formation layer is detached; (2) a method in which an amorphous silicon layer containing hydrogen and used as a separation layer is provided between a substrate that has an insulating surface and an element formation layer, and, by removal of the amorphous silicon layer by laser irradiation or by etching, the element formation layer is detached; (3) a method in which a substrate that has an insulating surface forming an element formation layer is removed mechanically or removed by etching using a solution, an $NF_3$ gas, or a halogen fluoride gas such as $BrF_3$, $ClF_3$, or the like; and (4) a method in which a metal layer and a metal oxide layer used as separation layers are provided between a substrate that has an insulating surface and an element formation layer, and after the metal oxide layer is made brittle by crystallization and part of the metal layer is removed by etching using a solution, an $NF_3$ gas, or a halogen fluoride gas such as $BrF_3$, $ClF_3$, or the like, the metal oxide layer made brittle is physically detached.

In addition, by use of a flexible substrate, a layer that has a thermoplastic resin, paper made from a fibrous material, or the like for the substrate that has flexibility to which the element formation layer is bonded, a semiconductor device that is small, thin, and lightweight can be obtained. It is to be noted that, for the flexible substrate, a plastic substrate made from polycarbonate, polyarylate, polyethersulfone, or the like can be given. In addition, for the layer that has a thermoplastic resin, polypropylene, polyester, vinyl, polyvinyl fluoride, vinyl chloride, or the like can be used.

Embodiment Mode 6

Figure 10A:
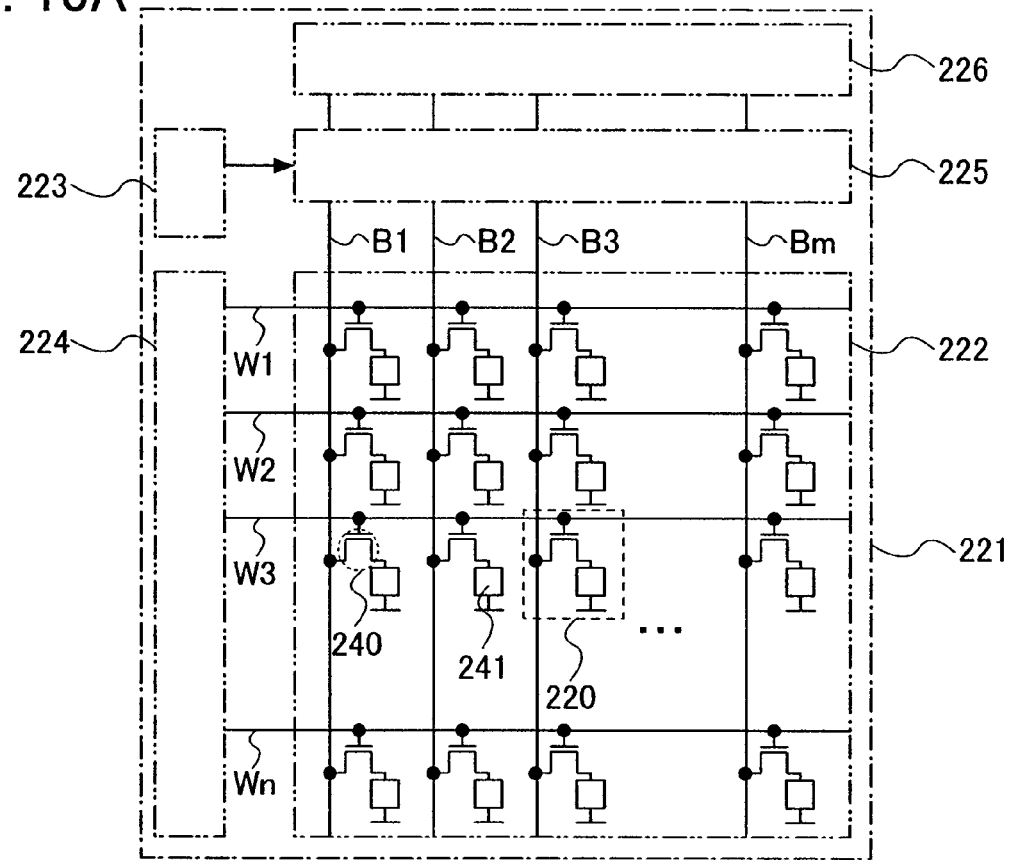
FIGS. 10A to 10C are diagrams used to explain a semiconductor device of the present invention.
Figure 10B:
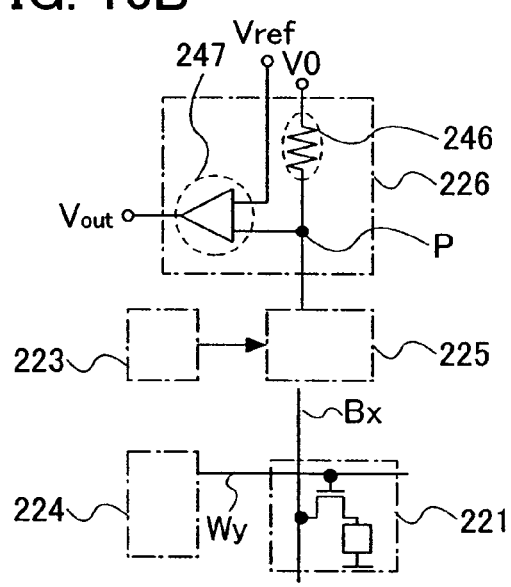
Figure 10C:
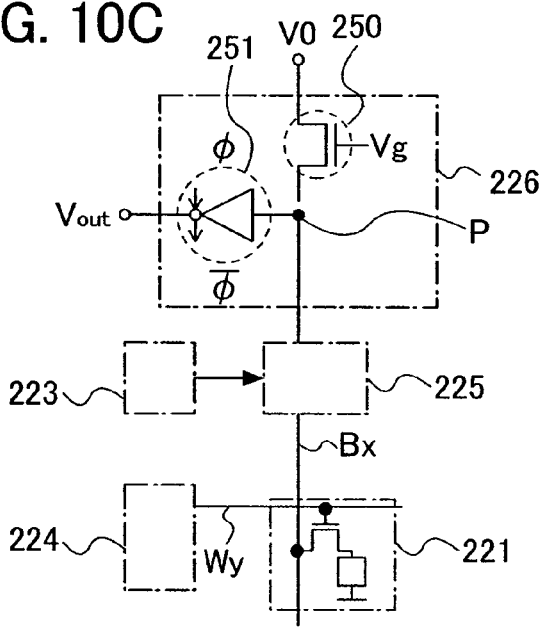

Data writing operations and data reading operations of a semiconductor device described in the above embodiment modes will be explained using FIGS. 10A to 10C.

A semiconductor device 221 includes decoders 223 and 224, a selector 225, a reading/writing circuit 226, and a memory cell array 222. The memory cell array 222 has a memory cell 220 that includes a transistor 240 and a memory element 241. The memory element 241 has a structure in which an organic compound layer is interposed between a pair of conductive layers. A gate electrode of the transistor 240 is connected to a word line Wy ($1 \leq y \leq n$), one of either a source electrode or drain electrode is connected to a bit line Bx ($1 \leq x \leq m$), and the other one of either the source electrode or drain electrode is connected to the first conductive layer of the memory element 241. The remaining second conductive layer of the memory element 241 is connected to a wiring. In addition, the wiring is connected to a common electrode (potential, Vcom).

Next, an operation during which writing of data to the semiconductor device 221 is performed will be explained.

Here, a case will be explained in which data is written to an $n^{th}$-row, $m^{th}$-column memory cell 220 by an electrical operation. It is to be noted that writing is performed in order to change the electrical characteristics of the memory cell; the initial state (a state under which electrical operations have not been performed) of a memory cell is set to be data of "0" and a state under which electrical characteristics have been changed is set to be data of "1."

When data of "1" is written to the memory cell 220, first, the memory cell 220 is selected by the decoders 223 and 224 and the selector 225. Specifically, by the decoder 224, a given voltage V22 is applied to a word line Wn connected to the memory cell 220. In addition, by the decoder 223 and the selector 225, the reading/writing circuit 226 is connected to a bit line Bm connected to the memory cell 220. Then, a writing voltage V21 is output from the reading/writing circuit 226 to a bit line B3.

In this way, the transistor 240 making up a memory cell is turned on, a bit line is electrically connected to the memory element 241, and, a voltage of approximately Vw=Vcom−V21 is applied. It is to be noted that the second conductive layer of the memory element 241 is connected to the common electrode with the potential Vcom. By selection, as appropriate, of the potential Vw, an organic compound layer provided between the pair of conductive layers is changed physically or electrically, and writing of data of "1" is performed. Specifically, in a reading operation voltage, the electrical resistance between the first conductive layer and the second conductive layer in a state of data of "1" may be changed so that the electrical resistance is much smaller than the resistance in a state of data of "0"; alternatively, the first conductive layer and the second conductive layer may simply be short-circuited (shorted). It is to be noted that the potentials can be selected from ranges so that (V21, V22, Vcom)=(from 5 V to 15 V, from 5 V to 15 V, 0 V) or (from −12 V to 0 V, from −12 V to 0 V, from 3 V to 5 V), as appropriate. The voltage Vw may be set from 5 V to 15 V or from −5 V to −15 V.

It is to be noted that writing is controlled so that data of "1" is not written to a memory cell connected to a non-selected word line and a non-selected bit line. Specifically, a potential (for example, a potential of 0 V) that turns off a transistor of a memory cell connected to a non-selected word line is applied to the non-selected word line; a non-selected bit line may be placed in a floating state, or a potential approximately equal to Vcom may be applied to the non-selected bit line.

On the other hand, when data of "0" is written to the memory cell 220, electrical operations need not be performed on the memory cell 220. In circuit operations, for example, even though, as in when data of "1" is written, the memory cell 220 is selected by the decoders 223 and 224 and the selector 225, either an output potential approximately equal to Vcom is output to the bit line B3 from the reading/writing circuit 226 or the bit line B3 is placed in a floating state. As a result, if no voltage is applied to the memory element 241 or only a low voltage (for example, a voltage ranging from -5 V to 5V) is applied to the memory element 241, electrical characteristics do not change, and writing of data of "0" can be achieved.

Next, an operation performed when data is read by an electrical operation will be explained. Reading of data is performed using the fact that electrical characteristics between the first conductive layer and the second conductive layer making up the memory cell are different for a memory cell that has data of "0" and for a memory cell that has data of "1." For example, a reading method that utilizes a difference in electrical resistance will be explained, where the electrical resistance of a memory element included in a memory cell that has data of "0" is set as R0 at a reading voltage, and the electrical resistance of a memory element included in a memory cell that has data of "1" is set as Ri at a reading voltage. It is to be noted that R1 and R0 are set so that R1<<R0. A reading/writing circuit, for a structure of the reading part, for example, a circuit 226, shown in FIG. 10B, that uses a resistive element 246 and a differential amplifier 247 can be considered. The resistive element 246 has a resistance of Rr, where Rr is set so that R1<Rr<R0. A transistor 250 may be used in place of the resistive element 246, and a clocked inverter 251 may be used in place of the differential amplifier 247 (FIG. 10C). Of course, the circuit structure is not limited to the structures shown in FIGS. 10B and 10C.

When reading of data from an $x^{th}$-row, $y^{th}$-column memory cell 220 is performed, first, the memory cell 220 is selected by the decoders 223 and 224 and the selector 225. Specifically, a given voltage V24 is applied by the decoder 224 to a word line Wy connected to the memory cell 220, and a transistor 240 is turned on. In addition, by the decoder 223 and the selector 225, a bit line Bx connected to the memory cell 220 is connected to a terminal P of the reading/writing circuit 226. As a result, a potential Vp of the terminal P, by resistance division of the resistive element 246 (resistance, Rr) and the memory element 241 (resistance, R0 or R1), becomes a determined value. Consequently, when the memory cell 220 has data of "0," the value for Vp0 becomes Vp0=Vcom+(V0−Vcom)×R0/(R0+Rr). Additionally, when the memory cell 220 has data of "1," the value for Vp1 becomes Vp1=Vcom+(V0−Vcom)×R1/(R1+Rr). As a result, as in FIG. 10B, by selection so that Vref is between Vp0 and Vp1, and, as in FIG. 10C, by selection so that the transition point of a clocked inverter is between Vp0 and Vp1, for an output potential Vout, in response to data of "0"/"1," Low/High (or High/Low) is output, and reading can be performed.

For example, a differential amplifier is set to operate at Vdd=3 V, and Vcom, V0, and Vref are set so that Vcom=0 V; V0=3 V, and Vref=1.5 V. Supposing that R0/Rr=Rr/R1=9, making it so that the on resistance of the transistor 240 can be ignored, when data of the memory cell is "0," Vp0 becomes Vp0=2.7 V, and Vout is output as High; when data of the memory cell is "1," Vp1 becomes Vp1=0.3 V, and Vout is output as Low. In this way, reading of the memory cell can be performed.

By performance of the above steps, using differences in the resistance of the memory element 241 and resistance division, the voltages can be read. Of course, the reading method is not limited to this method. For example, in addition to the use of differences in electrical resistances, reading may be performed using differences in electrical currents. Alternatively, when the electrical characteristics of the memory cell include diode characteristics in which threshold voltage varies for data of "0" and for data of "1," reading may be performed using the difference in threshold voltages.

Embodiment 1

In the present embodiment, an application of a semiconductor device, including a memory circuit by which data can be input and output wirelessly will be explained hereinafter with reference to drawings. A semiconductor device by which data can be input and output wirelessly is referred to as an RFID tag, an ID tag, an IC tag, an IC chip, an RF tag, a wireless tag, an electronic tag, or a wireless chip, depending on the usage mode.

Figure 11:
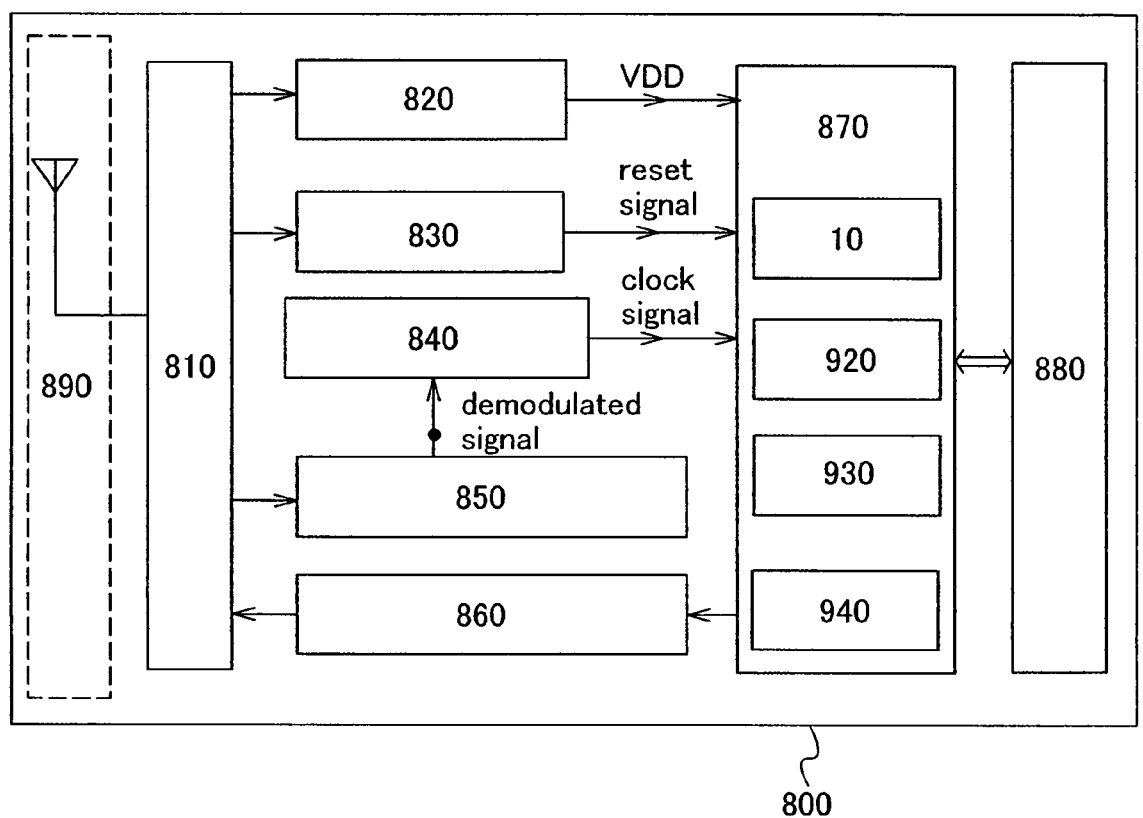
FIG. 11 is a diagram used to explain a semiconductor device of the present invention.

A semiconductor device 800, which has a function in which data can be exchanged wirelessly, includes a high frequency circuit 810, a power supply circuit 820, a reset circuit 830, a clock generator circuit 840, a data demodulation circuit 850, a data modulation circuit 860, a control circuit 870 used for controlling other circuits, a memory circuit 880, and an antenna 890 (FIG. 11). The high frequency circuit 810 is a circuit that receives a signal from the antenna 890 and outputs a signal from the antenna 890 received by the data modulation circuit 860; the power supply circuit 820 is a circuit that generates a power supply potential from a received signal; the reset circuit 830 is a circuit that generates a reset signal; the clock generator circuit 840 is a circuit that generates various clock signals based on a received signal input by the antenna 890; the data demodulation circuit 850 is a circuit that demodulates and outputs a received signal to the control circuit 870; and the data modulation circuit 860 is a circuit that modulates a signal received from the control circuit 870. In addition, for the control circuit 870, for example, a code extraction circuit 910, a code judgment circuit 920, a CRC judgment circuit 930, and an output unit circuit 940 are provided. It is to be noted that the code extraction circuit 910 is a circuit that extracts each of a plurality of codes included in commands transmitted by the control circuit 870, the code judgment circuit 920 is a circuit that compares extracted codes and codes corresponding to a reference and determines the content of commands, and the CRC judgment circuit 930 is a circuit that detects the presence of transmission errors and the like based on a determined code.

Next, an example of an operation of the semiconductor device described above will be explained. First, a wireless signal is received by the antenna 890. The wireless signal is transmitted to the power supply circuit 820 through the high frequency circuit 810, and a high power supply potential (hereinafter, referred to as VDD) is generated. VDD is supplied to each circuit in the semiconductor device 800. In addition, a signal transmitted to the data demodulation circuit 850 through the high frequency circuit 810 is demodulated (hereinafter referred to as a demodulated signal). Moreover, a signal passing through the reset circuit 830 via the high frequency circuit 810 and the demodulated signal passing through the clock generator circuit 840 are transmitted to the control circuit 870. The signal transmitted to the control circuit 870 is analyzed by the code extraction circuit 910, the code judgment circuit 920, the CRC judgment circuit 930, and the like. Then, in accordance with the analyzed signal, information about the semiconductor device stored in the memory circuit 880 is output. The output information about the semiconductor device passes through the output unit circuit 940 and is encoded. Furthermore, the encoded information about the semiconductor device passes through the data modulation circuit 860 and is transmitted as a radio signal by the antenna 890. It is to be noted that, in a plurality of circuits included in the semiconductor device 800, a low power supply potential (hereinafter referred to as VSS) is common, and VSS can be set as GND. In addition, a memory circuit described in the above embodiment modes can be applied to the memory circuit 880.

In this way, a signal is transmitted to the semiconductor device 800 from a reader/writer, and by receipt of the signal transmitted from the semiconductor device 800 by a detector (for example, a reader/writer), the reading of data of a semiconductor device becomes possible.

Furthermore, the semiconductor device 800 may be a type in which, for supply of a power supply voltage to each circuit, no electric power supply (battery) is installed, and a power supply voltage is supplied by use of electromagnetic waves; or the semiconductor device 800 may be a type in which, for supply of a power supply voltage to each circuit, an electric power supply (battery) is installed, and a power supply voltage is supplied to each circuit by use of electromagnetic waves or a battery.

Next, an example of a structure of a semiconductor device will be explained with reference to drawings. A top view of a semiconductor device of the present embodiment is shown in FIG. 12A and the structure of a cross section along X-Y in FIG. 12A is shown in FIG. 12B.

Figures 12A, 12B:
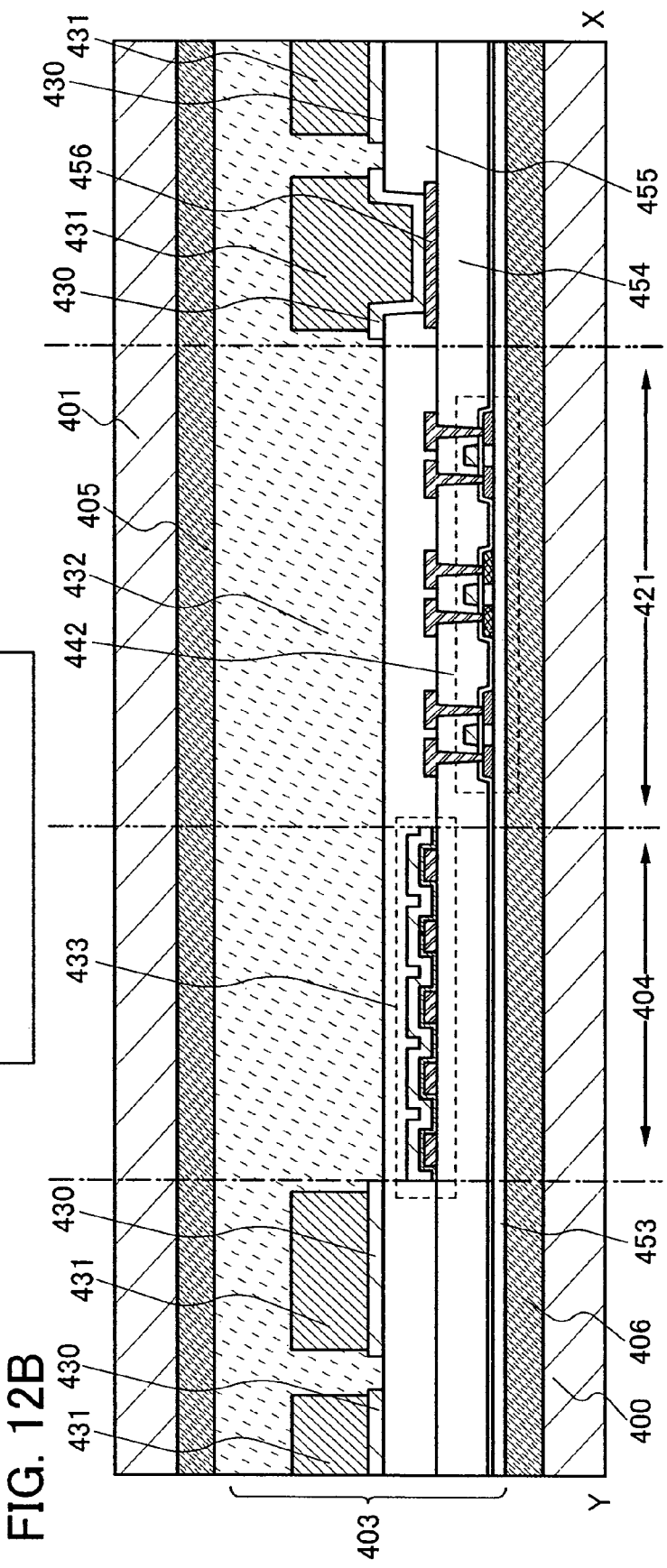
FIGS. 12A and 12B are top-view and cross-sectional diagrams used to explain a semiconductor device of the present invention.

As shown in FIG. 12A, in the semiconductor device, a memory circuit 404, an integrated circuit component 421, and an antenna 431 are provided over a substrate 400. It is to be noted that the memory circuit 404 shown in FIGS. 12A and 12B corresponds to the memory circuit 880 shown in FIG. 11; the integrated circuit component 421 shown in FIGS. 12A and 12B corresponds to the high frequency circuit 810, the power supply circuit 820, the reset circuit 830, the clock generator circuit 840, the data demodulation circuit 850, the data modulation circuit 860, and the control circuit 870 shown in FIG. 11; and the antenna 431 shown in FIGS. 12A and 12B corresponds to the antenna 890 shown in FIG. 11.

As shown in FIG. 12B, in the semiconductor device, an element formation layer 403 is interposed between substrates 400 and 401. In addition, the element formation layer 403 and the substrates 400 and 401 are bonded together by adhesives 406 and 405. Furthermore, an insulating layer 453 and a transistor 442 are formed in the element formation layer 403. Moreover, an insulating layer 454 is formed over the transistor 442, and a wiring and a memory cell array 433 are formed over the insulating layer 454. In addition, a conductive layer 430 and an antenna 431 are formed over the insulating layer 455 and the wiring, and an insulating layer 432 is formed over the antenna 431 and the insulating layer 455. The conductive layer 430 and the antenna 431 are connected to a wiring 456 formed over the insulating layer 454 through an opening formed in the insulating layer 455. The wiring 456 is connected to a high frequency circuit that is part of an integrated circuit. In addition, the memory circuit described in the above embodiment mode is included in the memory circuit 404, and an example is given in which the transistor 442 is included in the integrated circuit 421, but the integrated circuit may also include a resistive element, a capacitive element, a rectifier element, and the like.

In the present embodiment, the insulating layer 455 is formed using a polyimide layer; the conductive layer 430 is formed using stacked conductive layers of a titanium layer, an aluminum layer, and a titanium layer; and the antenna 431 is formed by a printing method using a silver alloy layer. The insulating layer 432 is formed to moderate unevenness of the antenna 431, and forming the insulating layer 432 by application of a composition, drying, and baking is preferable. Here, the insulating layer 432 is formed using an epoxy resin layer. For each of the substrates 400 and 401, a PEN layer is used; for each of the adhesives 406 and 405, a thermoplastic resin is used.

It is to be noted that the antenna may overlap with the memory circuit or be provided as a structure formed in the periphery so that it does not overlap with the memory circuit. In addition, when the antenna is formed overlapping the memory circuit, the antenna may be provided as a structure in which the entire surface or only part of the surface overlaps with the memory circuit. If the structure is one in which the antenna and memory circuit overlap, the number of malfunctions caused by noise and the like in a signal transmitted by the antenna, fluctuations in electromotive force generated by electromagnetic induction, and the like can be reduced, whereby reliability is improved. Furthermore, the semiconductor device can be miniaturized.

Moreover, for the signal transmission method of the semiconductor device described above in which data can be input and output wirelessly, an electromagnetic coupling method, an electromagnetic induction method, a microwave method, or the like can be used. An appropriate transmission method may be selected by a practitioner upon consideration of the application use, and the most suitable antenna for the selected transmission method may be provided.

For example, for the signal transmission method of the semiconductor device, when the electromagnetic coupling method or the electromagnetic induction method (for example, one using electromagnetic waves with a frequency at the 13.56 MHz band) is employed, because electromagnetic induction by change in the magnetic field density is used, the antenna 431 is formed as a ring (for example, as a loop antenna) or as a spiral (for example, as a spiral antenna).

Furthermore, for the signal transmission method of the semiconductor device, when the microwave method (for example, one using microwaves in the UHF band (in the 860 MHz to 960 MHz range), at the 2.45 GHz band, or the like) is employed, the shape such as the length or the like of the antenna 431 may be set appropriately upon consideration of the wavelength of the electromagnetic waves used in the signal transmission method; for example, the antenna 431 can be formed as a line (for example, as a dipole antenna), as a flat shape (for example, as a patch antenna), as a ribbon, or the like. In addition, the shape of the antenna 431 is not limited to a line, and, upon consideration of the wavelength of the electromagnetic waves, the antenna 431 may be formed as a curved line, as an S-shape, or as a combination of any of these shapes.

The antenna 431 is formed from a conductive material using a CVD method; a sputtering method; a printing method such as a screen printing method, a gravure printing method, or the like; a droplet discharge method; a dispenser method; a plating method; or the like. The conductive material is formed as a single-layer or multilayer structure formed of a metal element or elements selected from aluminum (Al), titanium (Ti), silver (Ag), copper (Cu), gold (Au), platinum (Pt), nickel (Ni), palladium (Pd), tantalum (Ta), and molybdenum (Mo); or of an alloy material or a compound material with one or more of any of these elements as the main component.

For example, when the antenna is formed using a screen printing method, the antenna can be formed by selective printing of a conductive paste in which an organic resin of conductive particles with grain diameter of from several nanometers to several tens of nanometers is dissolved or dispersed, drying, and baking. For the conductive particles, metal particles of one or more of any of silver (Ag), gold (Au), copper (Cu), nickel (Ni), platinum (Pt), palladium (Pd), tantalum (Ta), molybdenum (Mo), titanium (Ti), and the like; fine particles of a silver halide; or dispersible nanoparticles can be used. In addition, for the organic resin contained in the conductive paste, one or a plurality of organic resins functioning as a binder, a solvent, a dispersant, or a coating material of the metal particles can be used. Typically, an organic resin such as an epoxy resin, a silicone resin, and the like can be given. In addition to the above materials, ceramic, ferrite, or the like may be applied for the antenna.

In addition, for when the electromagnetic coupling method or the electromagnetic induction method is employed, when the semiconductor device including an antenna is provided so as to come into contact with metal, providing a magnetic material having magnetic permeability between the semiconductor device and the metal is preferable. When the semiconductor device including an antenna is provided so as to come into contact with metal, an eddy current flows with changes in the magnetic field; by generation of a demagnetizing field by the eddy current, changes in the magnetic field are weakened, and the distance at which communication can be exchanged decreases. For that reason, by provision of a material with magnetic permeability between the semiconductor device and the metal, the eddy current can be controlled, and the decrease in the distance at which communication can be exchanged can be suppressed. It is to be noted that, for the magnetic material, ferrite or a metallic thin layer, which both have a high magnetic permeability but little high frequency loss, can be used.

Furthermore, in the present embodiment, the semiconductor device in which a semiconductor element, such as a transistor or the like, and the antenna are directly formed in the element formation layer is described; however, the present invention is not limited to the semiconductor device of the present embodiment. For example, a semiconductor device may be formed in which, after a semiconductor element and an antenna are formed over separate substrates, the substrates are attached to each other so that the semiconductor element and the antenna are electrically connected to each other.

With the present invention, a semiconductor device, including a nonvolatile memory element in which data can be added at times other than during manufacture and in which forgery and the like by rewriting of data can be prevented, can be manufactured. In addition, a semiconductor device with a high level of reliability and a low cost can be manufactured.

Figure 13A:
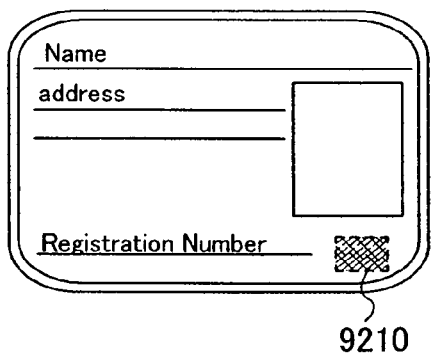
FIGS. 13A to 13F are diagrams that illustrate an application of a semiconductor device of the present invention.
Figure 13B:
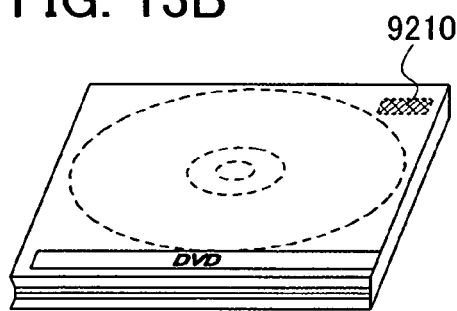
Figure 13C:
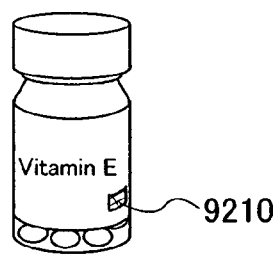
Figure 13D:
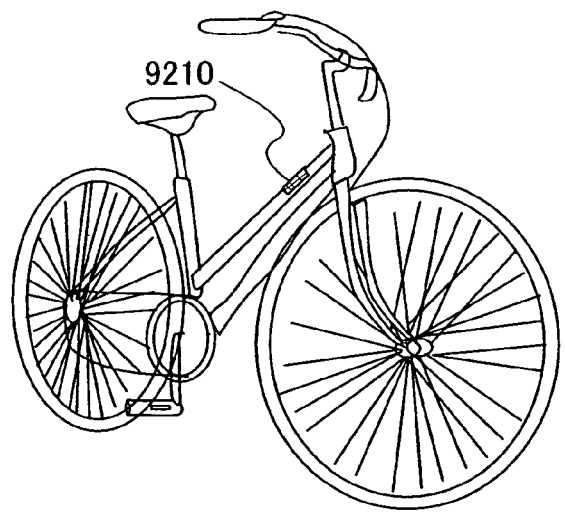
Figure 13E:
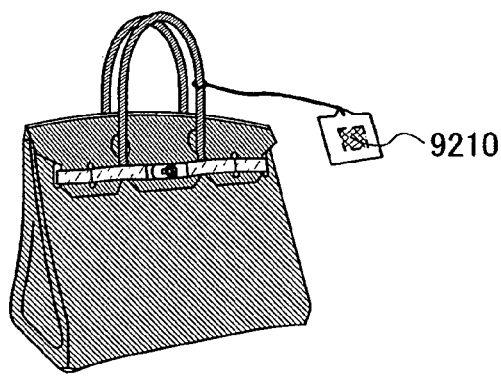
Figure 13F:
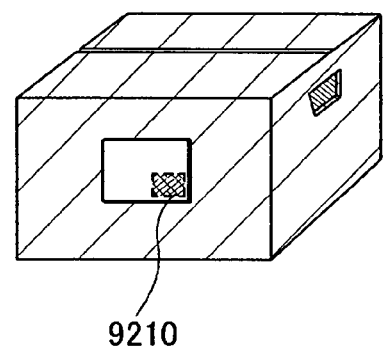

The range of application for a semiconductor device in which input and output of data wirelessly can be performed covers a wide range; for example, the semiconductor device can be provided and used in articles such as paper money, coins, securities, unregistered bonds, certificates (driver's licenses, resident's cards, and the like; refer to FIG. 13A), packaging containers (wrapping paper, bottles, and the like; refer to FIG. 13C), recording media (DVDs, video tapes, and the like; refer to FIG. 13B), vehicles (bicycles and the like; refer to FIG. 13D), personal belongings (bags, eyeglasses, and the like), food products, plants, clothing, articles for daily use, and the like; tags on goods, such as electronic devices and the like, or on luggage (refer to FIGS. 13E and 13F); and the like. In addition, the semiconductor device can be placed in animals and inside the human body. Electronic devices refer to liquid crystal display devices, EL (electroluminescence) display devices, television devices (also referred to as simply TVs, TV receivers, and television receivers), cellular telephones, and the like.

A semiconductor device 9210 of the present invention is affixed to an article by being mounted to a printed circuit board, by being attached to a surface of the article, or by being embedded in the article. For example, for a book, the semiconductor device 9210 is embedded in the paper; for packaging made of an organic resin, the semiconductor device 9210 is embedded in the organic resin; the semiconductor device 9210 is affixed to each article. The semiconductor device 9210 of the present invention is one by which a small, thin, and lightweight semiconductor device is realized; therefore, even after the semiconductor device 9210 has been affixed to an article, the design characteristics of the article itself are not affected. In addition, by provision of the semiconductor device 9210 of the present invention in paper money, coins, securities, unregistered bonds, certificates, and the like, an authentication function can be provided; if this authentication function is utilized, forgery can be prevented. Furthermore, by provision of the semiconductor device 9210 of the present invention in packaging containers, storage media, personal belongings, foods, clothing, articles for daily use, electronics, and the like, improvement in the efficiency of systems, such as inspection systems and the like, can be realized.

Figure 14A:
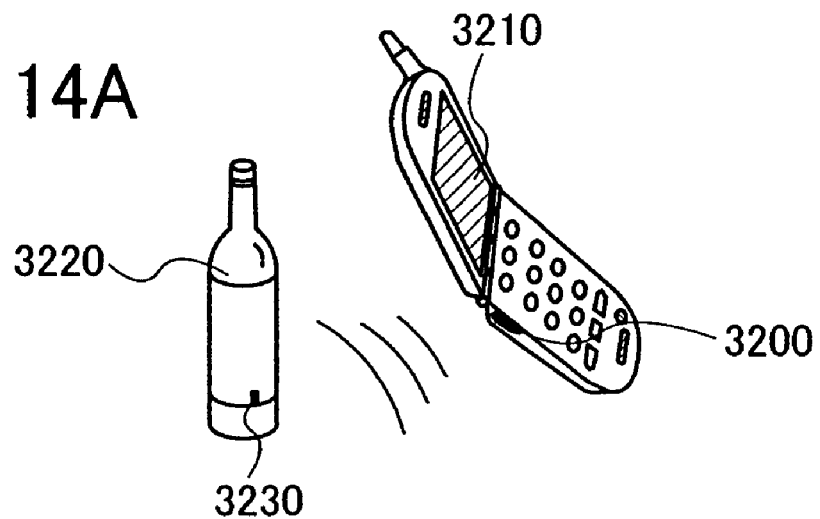
FIGS. 14A and 14B are diagrams that illustrate an application of a semiconductor device of the present invention.
Figure 14B:
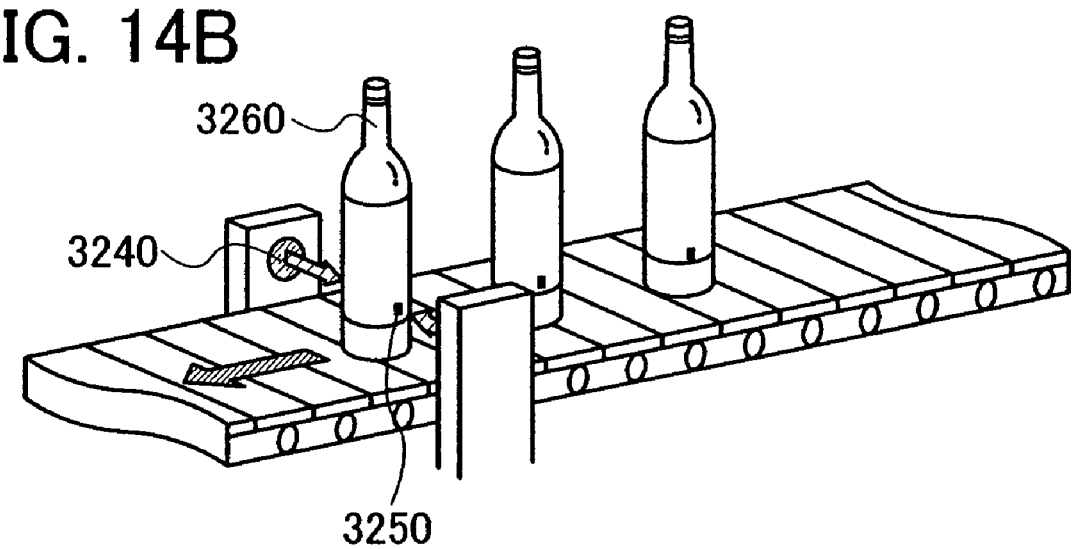

Next, an example of a use form of a semiconductor device in which data can be input and output wirelessly will be explained. A detector (for example, a reader/writer) 3200 is provided on a side surface of a portable terminal that includes a display 3210, and a semiconductor device 3230 is provided on a side surface of an article 3220 (FIG. 14A). If the article 3220 including the semiconductor device 3230 is held up to the detector (for example, a reader/writer) 3200, information related to the article, such as records of raw materials used and place of origin, test results for each manufacturing process, a history of the distribution process, a description of the article, and the like, are displayed on the display 3210. In addition, when an article 3260 is transported by a conveyor belt, by use of a detector (for example, a reader/writer) 3240 and a semiconductor device 3250 provided in the article 3260, inspection of the article 3260 can be performed (FIG. 14B). As thus described, by application of the semiconductor device in a system, acquisition of information can be performed quite easily, and a shift to a high level of functionality and a high added value can be achieved.

Figure 15:
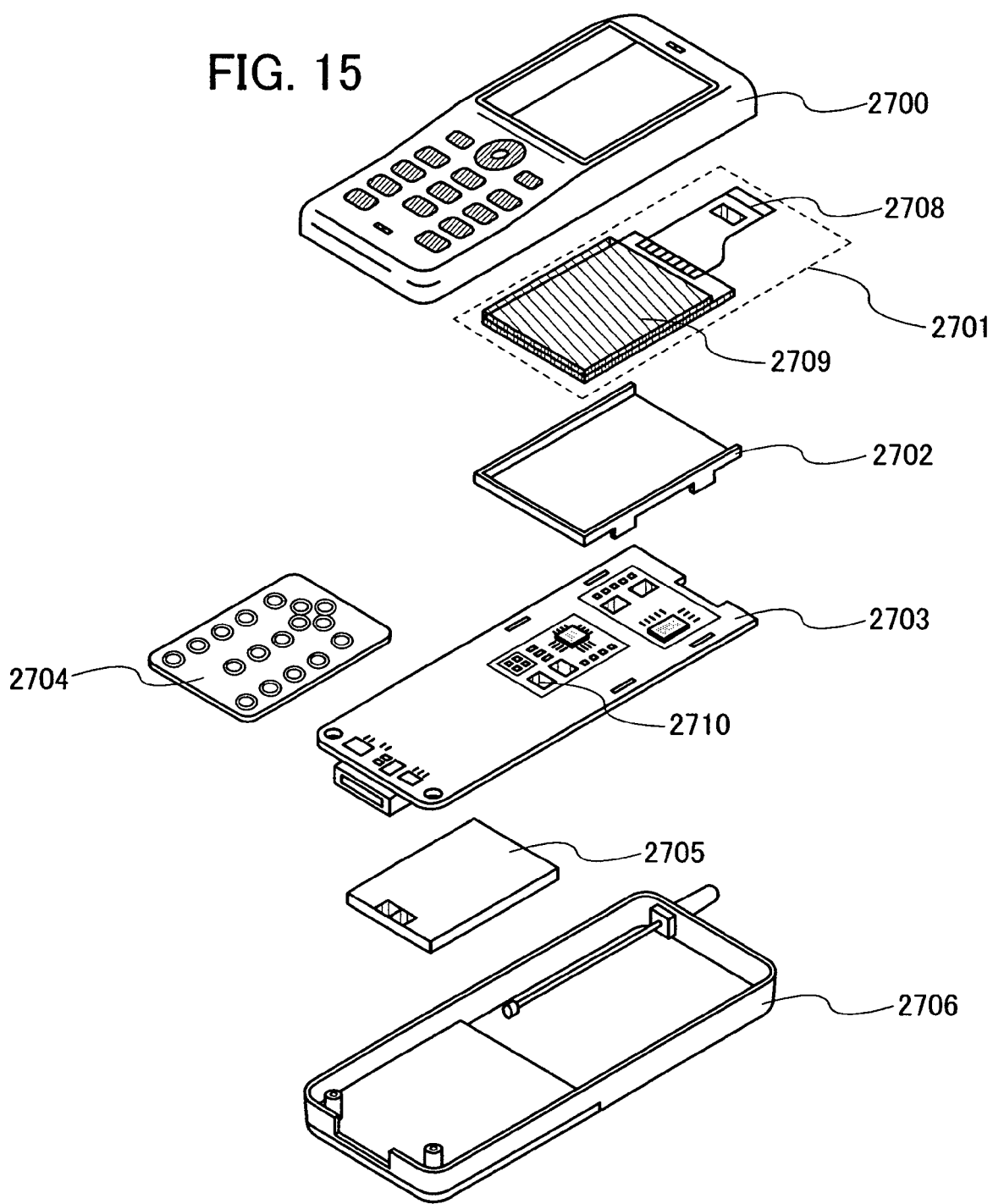
FIG. 15 is a diagram that illustrates an application of a semiconductor device of the present invention.

Next, one embodiment of an electronic device in which the semiconductor device of the present invention is implemented will be explained with reference to the drawings. The example of an electronic device illustrated here is of a cellular telephone, which includes housings 2700 and 2706, a panel 2701, a housing 2702, a printed circuit board 2703, operation buttons 2704, and a battery 2705 (refer to FIG. 15). The panel 2701 is implemented in the housing 2702 in such a way that it can be inserted or removed freely, and the printed circuit board 2703 is fitted to the housing 2702. The shape and dimensions of the housing 2702 are changed appropriately to conform to the shape and dimensions of the panel 2701 incorporated in the electronic device. A plurality of packaged semiconductor devices are mounted on the printed circuit board 2703, and out of the plurality of semiconductor devices, one can be used as a semiconductor device 2710 of the present invention. The plurality of the semiconductor devices mounted on the printed circuit board 2703 function as any of the following: a controller, a central processing unit (CPU), a memory circuit, a power supply circuit, an audio processing circuit, a transmitter-receiver circuit, or the like.

The panel 2701 is connected to the printed circuit board 2703 through a connective film 2708. The panel 2701, the housing 2702, and the printed circuit board 2703 are placed inside the housings 2700 and 2706 along with the operation buttons 2704 and the battery 2705. A pixel region 2709 included in the panel 2701 is positioned in such a way that it is visible through an aperture window provided in the housing 2700.

As described above, the semiconductor device of the present invention has the characteristics of being small in size, thin, and lightweight; by the aforementioned characteristics, limited space inside the housings 2700 and 2706 of the electronic device can be used effectively.

In addition, because the semiconductor device of the present invention includes a memory element that has a simple structure of an organic compound layer interposed between a pair of conductive layers changed by application of an external voltage, an electronic device using a low-cost semiconductor device can be provided. Furthermore, because the semiconductor device of the present invention is one in which a high level of integration can be achieved, an electronic device using a semiconductor device that includes a large number of memory circuits can be provided.

In addition, a semiconductor device that includes the semiconductor device of the present invention has the characteristics of being a semiconductor device in which writing of data is performed by application of an external voltage, a nonvolatile semiconductor device, and a semiconductor device in which data can be added. Through the above characteristics, forgery by rewriting of data can be prevented, and new data can be added and written. Consequently, an electronic device using a semiconductor in which a shift to a high level of functionality and a high added value are achieved can be provided.

It is to be noted that the housings 2700 and 2706 indicate an example of the appearance and shape of a cellular telephone, but electronic devices of the present embodiment can be changed into various modes depending on the functions and intended use.

This application is based on Japanese Patent Application serial No. 2006-127124 filed in Japan Patent Office on Apr. 28, 2006, the contents of which are hereby incorporated by reference.

What is claimed is:

1. A semiconductor device comprising:
    a wiring; and
    a memory element comprising:
        a first conductive layer,
        an organic compound layer over the first conductive layer and the wiring, and
        a second conductive layer over the organic compound layer;
    wherein the wiring is connected with the second conductive layer through an opening in the organic compound layer.

2. The semiconductor device according to claim 1, wherein the wiring and the first conductive layer are in contact with a substrate or a layer having an insulating property.

3. The semiconductor device according to claim 1, wherein the wiring and the first conductive layer are formed at a same time.

4. The semiconductor device according to claim 1, wherein the organic compound layer comprises at least one of an organic compound that has a hole transporting property or an organic compound that has an electron transporting property.

5. The semiconductor device according to claim 1, wherein the memory element is formed in a region in which the first conductive layer, the organic compound layer, and the second conductive layer overlap.

6. The semiconductor device according to claim 1, further comprising a rectifier element connected to the memory element.

7. The semiconductor device according to claim 1, further comprising a switching element connected to the first conductive layer.

8. The semiconductor device according to claim 1, further comprising a driver circuit connected to the wiring.

9. The semiconductor device according to claim 8, wherein the driver circuit comprising at least one of a decoder or a selector.

10. The semiconductor device according to claim 1, wherein a thickness of the organic compound layer is from 5 nm to 100 nm.

11. The semiconductor device according to claim 1, wherein the second conductive layer is a bit line.

12. The semiconductor device according to claim 1, wherein the second conductive layer is a word line.

13. A semiconductor device comprising:
    a first wiring;
    a second wiring; and
    a memory element comprising:
        a first conductive layer;
        an organic compound layer over the first conductive layer, the first wiring, and the second wiring; and
        a second conductive layer over the organic compound layer,
    wherein the second conductive layer is connected to the first wiring and the second wiring through a first opening and a second opening in the organic compound layer, respectively.

14. The semiconductor device according to claim 13, wherein the first wiring, the second wiring and the first conductive layer are in contact with a substrate or a layer having an insulating property.

15. The semiconductor device according to claim 13, wherein the first wiring and the second wiring are formed at a same time as the first conductive layer and the second conductive layer.

16. The semiconductor device according to claim 13,
    wherein the first conductive layer is between the first wiring and the second wiring, and
    wherein the first wiring and the second wiring overlap with the second conductive layer.

17. The semiconductor device according to claim 13, wherein the memory element is formed in a region in which the first conductive layer, the organic compound layer, and the second conductive layer overlap.

18. The semiconductor device according to claim 13, further comprising a rectifier element connected to the memory element.

19. The semiconductor device according to claim 13, further comprising a switching element connected to the first conductive layer.

20. The semiconductor device according to claim 13, further comprising a driver circuit connected to the first wiring.

21. The semiconductor device according to claim 20, wherein the driver circuit comprising at least one of a decoder or a selector.

22. The semiconductor device according to claim 13, wherein a thickness of the organic compound layer is from 5 nm to 100 nm.

23. The semiconductor device according to claim 13, wherein the second conductive layer is a bit line.

24. The semiconductor device according to claim 13, wherein the second conductive layer is a word line.

25. The semiconductor device according to claim 13, wherein the organic compound layer comprises at least one of an organic compound that has a hole transporting property or an organic compound that has an electron transporting property.

* * * * *

UNITED STATES PATENT AND TRADEMARK OFFICE
CERTIFICATE OF CORRECTION

PATENT NO. : 7,923,719 B2
APPLICATION NO. : 11/790348
DATED : April 12, 2011
INVENTOR(S) : Shunpei Yamazaki et al.

Page 1 of 1

It is certified that error appears in the above-identified patent and that said Letters Patent is hereby corrected as shown below:

At column 5, line 53, "TIN" should be --TiN--;

At column 13, line 1, "SE" should be --5E--;

At column 16, line 15, "Bx ($1 \leqq s \leqq m$)" should be --Bx ($1 \leqq x \leqq m$)--;

At column 25, line 12, "as Ri" should be --as R1--.

Signed and Sealed this
Fifteenth Day of November, 2011

David J. Kappos
*Director of the United States Patent and Trademark Office*